(12) United States Patent
Kato et al.

(10) Patent No.: US 7,161,832 B2
(45) Date of Patent: Jan. 9, 2007

(54) NON-VOLATILE SEMICONDUCTOR MEMORY DEVICE

(75) Inventors: Junichi Kato, Muko (JP); Masayoshi Nakayama, Kusatsu (JP); Takao Ozeki, Takatsuki (JP); Asako Miyoshi, Kusatsu (JP); Shinichi Hatakeyama, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 33 days.

(21) Appl. No.: 11/143,581

(22) Filed: Jun. 3, 2005

(65) Prior Publication Data

US 2005/0276103 A1 Dec. 15, 2005

(30) Foreign Application Priority Data

Jun. 15, 2004 (JP) .............................. 2004-177263

(51) Int. Cl.
*G11C 11/34* (2006.01)
*G11C 16/04* (2006.01)

(52) U.S. Cl. .............................. 365/185.05; 365/189.08

(58) Field of Classification Search ........... 365/185.05, 365/189.08, 64, 51
See application file for complete search history.

(56) References Cited

U.S. PATENT DOCUMENTS 5,519,244 A * 5/1996 Yatsuda et al. ............. 257/372
5,646,885 A * 7/1997 Matsuo et al. .......... 365/185.05
6,094,368 A * 7/2000 Ching ........................... 365/49
6,188,608 B1 * 2/2001 Maruyama et al. ....... 365/185.2
RE37,311 E 8/2001 Kato et al.
6,529,407 B1 * 3/2003 Shukuri .................. 365/185.07
6,545,915 B1 4/2003 Ohtani et al.
6,614,684 B1 * 9/2003 Shukuri et al. ......... 365/185.05
6,788,572 B1 * 9/2004 Yamada et al. ......... 365/185.03

FOREIGN PATENT DOCUMENTS

JP 6-268180 9/1994

OTHER PUBLICATIONS

Fujio Masoka et al., "Furasshu Memori Gijyutsu Hando Bukku [Flash Memory Technical Handbook]" Aug. 15, 1993, Science Forum, p. 37.

* cited by examiner

*Primary Examiner*—Richard Elms
*Assistant Examiner*—Allison Bernstein
(74) *Attorney, Agent, or Firm*—McDermott Will & Emery LLP

(57) ABSTRACT

A switch section connects a first wire line aSL to the gate of a first memory transistor 1 and the source of a second memory transistor 2 and a second wire line bSL to the source of the first memory transistor 1 and the gate of the second memory transistor 2 when first type data is to be written into a memory cell; and connects the first wire line aSL to the source of the first memory transistor 1 and the gate of the second memory transistor 2 and the second wire line bSL to the gate of the first memory transistor 1 and the source of the second memory transistor 2 when second type data is to be written into a memory cell.

11 Claims, 10 Drawing Sheets

F I G. 6
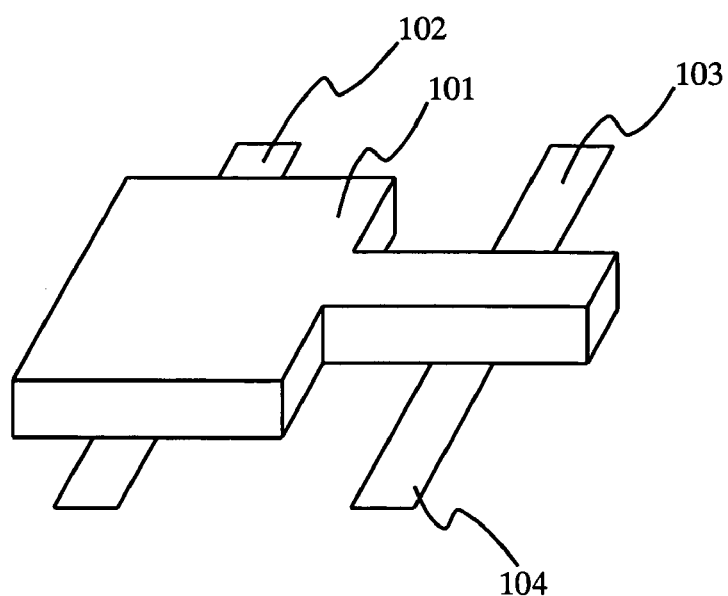

NON-VOLATILE SEMICONDUCTOR MEMORY DEVICE

BACKGROUND OF THE INVENTION

1. Field of the Invention

The present invention relates to a non-volatile semiconductor memory device, and more particularly, a non-volatile semiconductor memory device in which a plurality of memory cells for storing data are arranged in a matrix.

2. Description of the Background Art

Electrically rewritable non-volatile semiconductor memory devices (hereinafter referred to as "non-volatile semiconductor memory devices") have a property such that data is not lost when the device is powered off. Conventional non-volatile semiconductor memory devices have a structure which is described in, for example, "Furasshu Memori Gijyutsu Hando Bukku [Flash Memory Technical Handbook]" (Fujio Masoka, et al., 1993, Science Forum, p. 37). Hereinafter, conventional non-volatile semiconductor memory devices will be described.

In a conventional non-volatile semiconductor memory device, a rewrite operation is achieved by injection or ejection of electrons with respect to a floating gate of a transistor in a memory cell. The floating gate electrically floats. By injection or ejection of electrons with respect to the floating gate, the threshold voltage of a transistor is changed. A written state and an erased state of the transistor are distinguished from each other using the change of the threshold voltage. During a read operation, for example, a voltage read from the transistor of a memory cell is compared with a reference voltage by a differential amplifier to determine whether data is "1" or "0".

However, in the above-described conventional non-volatile semiconductor memory device, the threshold voltage of the memory cell transistor is changed due to repetition of data rewrite, so that a difference between a voltage read from the memory cell transistor and the reference voltage is reduced. When the difference between the read voltage and the reference voltage becomes small, an error occurs in reading the data.

To solve this problem, a non-volatile semiconductor memory device has been proposed in Japanese Patent Laid-Open Publication No. H6-268180 (pp. 3–4, FIG. 1). Hereinafter, the non-volatile semiconductor memory device will be described with reference to FIG. 10. FIG. 10 is a diagram illustrating a cross-sectional structure of one cell of the non-volatile semiconductor memory device.

In the non-volatile semiconductor memory device of FIG. 10, two Nch transistors 901 and 902 are provided in each cell. One cell stores one-bit data. The non-volatile semiconductor memory device comprises a semiconductor substrate 1001, a source 1002, drains 1003 and 1004, tunnel oxide films 1005 and 1009, floating gates 1006 and 1010, gate oxide films 1007 and 1011, control gates 1008 and 1012, a source line 1013, a bit line 1014, a complementary bit line 1015, and a word line 1016.

The drain 1003, the source 1002 and the drain 1004 are appropriately spaced from each other on a surface of the semiconductor substrate 1001. The tunnel oxide film 1005 is provided between the source 1002 and the drain 1003 on the surface of the semiconductor substrate 1001. The floating gate 1006 is provided on the tunnel oxide film 1005. Further, the gate oxide film 1007 is provided on the floating gate 1006. Furthermore, the control gate 1008 is provided on the gate oxide film 1007. The tunnel oxide film 1009 is provided between the source 1002 and the drain 1004 on the surface of the semiconductor substrate 1001. The floating gate 1010 is provided on the tunnel oxide film 1009. Further, the gate oxide film 1011 is provided on the floating gate 1010. Furthermore, the control gate 1012 is provided on the gate oxide film 1011.

The source line 1013 is connected to the source 1002. The bit line 1014 is connected to the drain 1003. The complementary bit line 1015 which is complementary to the bit line 1014 is connected to the drain 1004. The word line 1016 is connected to the control gate 1008 and the control gate 1012. Note that the bit line 1014 and the complementary bit line 1015 are connected to a differential amplifier circuit (not shown) during a read operation.

An operation of the non-volatile semiconductor memory device thus constructed will be described. It is now assumed that, in the non-volatile semiconductor memory device, a state that data "1" is written refers to a state that electrons have been injected into the floating gate 1006 of the Nch transistor 901 while electrons have not been injected into the floating gate 1010 of the Nch transistor 902. A state that data "0" is written refers to a state that electrons have not been injected into the floating gate 1006 of the Nch transistor 901 while electrons have been injected to the floating gate 1010 of the Nch transistor 902.

Firstly, an operation of the non-volatile semiconductor device when writing data "1" will be described. To write data "1", a power source voltage (e.g., 5 V) is applied to the bit line 1014, while the ground potential is applied to the complementary bit line 1015. A voltage (e.g., 12 V) which is higher than the power source voltage is applied to the word line 1016, while the ground potential is applied to the source line 1013.

When the voltages are applied in this manner, hot electrons are generated in the vicinity of the drain 1003, so that the hot electrons are injected into the floating gate 1006. On the other hand, hot electrons are not generated in the vicinity of the drain 1004, and therefore, electrons are not injected into the floating gate 1010.

With the above-described operation, the Nch transistor 901 is controlled into the written state, while the Nch transistor 902 is controlled into the erased state. As a result, data "1" is written into the non-volatile semiconductor device.

Next, an operation of the non-volatile semiconductor device when writing data "0" will be described. To write data "0", the ground potential is applied to the bit line 1014, while the power source voltage (e.g., 5 V) is applied to the complementary bit line 1015. Further, a voltage (e.g., 12 V) which is higher than the power source voltage is applied to the word line 1016, while the ground potential is applied to the source line 1013.

When the voltages are applied in this manner, hot electrons are generated in the vicinity of the drain 1004, so that the hot electrons are injected into the floating gate 1010. On the other hand, hot electrons are not generated in the vicinity of the drain 1003, so that electrons are not injected into the floating gate 1006.

With the above-described operation, the Nch transistor 901 is controlled into the erased state, while the Nch transistor 902 is controlled into the written state. As a result, data "0" is written into the non-volatile semiconductor device.

Next, a data read operation of the non-volatile semiconductor device of FIG. 10 will be described. Firstly, a read operation when data "1" has been written will be described.

During the read operation, the power source voltage (e.g., 5 V) is applied to the word line 1016. A voltage (e.g., 2 V)

which is lower than the power source voltage is applied to the bit line 1014 and the complementary bit line 1015.

In this situation, electrons have been injected in the floating gate 1006 of the Nch transistor 901. Therefore, the threshold voltage of the Nch transistor 901 is higher than the power source voltage. As a result, the Nch transistor 901 is controlled into an OFF state, so that a current does not flow from the drain 1003 to the source 1002. Therefore, substantially no voltage drop occurs in the bit line 1014.

On the other hand, electrons are not injected in the floating gate 1006 of the Nch transistor 902. Therefore, the threshold voltage of the Nch transistor 902 is lower than the power source voltage. As a result, the Nch transistor 902 is controlled into an ON state, so that a current flows from the drain 1004 to the source 1002. Therefore, a voltage drop occurs in the complementary bit line 1015.

The differential amplifier which is connected to the bit line 1014 and the complementary bit line 1015 detects a difference in voltage drop between the wire lines to determine the data. In this case, since data "1" is read out, the differential amplifier outputs a negative voltage.

Next, a read operation when data "0" has been written will be described. Note that a voltage which is applied to each wire line is similar to when data "1" has been written and will not be explained.

In this situation, electrons have not been injected in the floating gate 1006 of the Nch transistor 901. Therefore, the threshold voltage of the Nch transistor 901 is lower than the power source voltage. As a result, the Nch transistor 901 is controlled into an ON state, so that a current flows from the drain 1003 to the source 1002. Therefore, a voltage drop occurs in the bit line 1014.

On the other hand, electrons have been injected in the floating gate 1006 of the Nch transistor 902. Therefore, the threshold voltage of the Nch transistor 902 is higher than the power source voltage. As a result, the Nch transistor 902 is controlled into an OFF state, so that a current does not flow from the drain 1004 to the source 1002. Therefore, a voltage drop does not occur in the complementary bit line 1015.

The differential amplifier connected to the bit line 1014 and the complementary bit line 1015 detects a difference in voltage drop between these wire lines to determine the data. In this case, since data "0" is read out, the differential amplifier outputs a positive voltage.

As described above, in the non-volatile semiconductor memory device of FIG. 10, the data determination is performed using the difference between the voltages read from the two transistors included in one cell, but not using the reference voltage. As a result, errors in reading the data are reduced in the non-volatile semiconductor memory device of FIG. 10. Hereinafter, a more detailed description will be given.

In conventional non-volatile semiconductor devices, voltages read from the transistors of a memory cell are compared with a reference voltage to determine the data. The reference voltage is a voltage which has substantially an intermediate value between a voltage value read from a memory cell in the written state and a voltage value read from a memory cell in the erased state.

In contrast, in the non-volatile semiconductor device of FIG. 10, one of the transistors is controlled into the written state while the other is controlled into the erased state, to write data into a memory cell. To read data from a memory cell, a difference between voltages read from the two transistors is used to determine the data. Therefore, the voltage difference used in the data determination is a difference between a voltage read from a memory cell in the written state and a voltage read from the memory cell in the erased state. Therefore, in the non-volatile semiconductor memory device of FIG. 10, the voltage difference used for the data determination during a read operation is larger than that of the conventional non-volatile semiconductor memory device, so that an error is unlikely to occur in reading data.

In the non-volatile semiconductor memory device of FIG. 10, the voltage difference used for the data determination during the read operation is larger than that of the conventional non-volatile semiconductor memory device. Therefore, even when the amount of electrons to be injected into the floating gates 1006 and 1010 is smaller than that of the conventional non-volatile semiconductor device, an error occurs with a lower possibility in reading data. In other words, in the non-volatile semiconductor memory device of FIG. 10, even when the thickness of the tunnel oxide films 1005 and 1009 is reduced, an error is less likely to occur in reading data. Thus, the thickness of the tunnel oxide films 1005 and 1009 can be reduced, thereby achieving a high-speed and low-voltage operation of the non-volatile semiconductor memory device.

However, in the non-volatile semiconductor memory device of FIG. 10, an erase operation in which injected electrons are extracted out from the floating gate 1006 of the Nch transistor 901 or the floating gate 1010 of the Nch transistor 902 is required for rewriting of data "1" into data "0" or data "0" into data "1". Therefore, in the non-volatile semiconductor memory device of FIG. 10, it disadvantageously takes a long time to rewrite data. Hereinafter, for example, the rewriting of data "1" into data "0" will be described in detail.

When data "1" is stored in a memory cell, electrons have been injected in the floating gate 1006 of the Nch transistor 901, while electrons have not been injected in the floating gate 1010 of the Nch transistor 902. In this case, when an operation of writing data "0" into a memory cell is performed without extracting out the electrons injected in the floating gate 1006 (erase operation), electrons are injected into both the floating gate 1006 and the floating gate 1010. As a result, the differential amplifier can no longer determine data stored in the memory cell when reading out the data. Therefore, data in the memory cell needs to be erased before rewriting the data in the memory cell. Therefore, it disadvantageously takes a long time to rewrite data in the non-volatile semiconductor memory device of FIG. 10.

SUMMARY OF THE INVENTION

Therefore, an object of the present invention is to provide a non-volatile semiconductor memory device in which data can be rewritten quickly and an error is unlikely to occur in reading, and a production method thereof.

In a non-volatile semiconductor memory device of the present invention, each memory cell comprises a first memory transistor and a second memory transistor each having a floating gate. A plurality of first wire lines are arranged in a row direction, wherein a first voltage is applied to the first wire line during a data write operation. A plurality of second wire lines are paired with the respective first wire lines and extend in the row direction, wherein a second voltage is applied to the second wire line, the second voltage being lower than the first voltage during the data write operation. A switch section switches connections of the first memory transistor, the second memory transistor, the first wire line, and the second wire line. When first type data is to be written into the memory cell, the switch section connects the first wire line to a gate of the first memory transistor and a source of the second memory transistor, and the second wire line to a source of the first memory transistor and a gate of the second memory transistor. When a second type data is to be written into the memory cell, the switch section connects the first wire line to the source of the first memory transistor and the gate of the second memory transistor, and the second wire line to the gate of the first memory transistor and the source of the second memory transistor.

The switch section may comprise a plurality of switch circuits provided in the respective memory cells, of switching connections of the first wire line, the second wire line, the source of the first memory transistor, the source of the second memory transistor, the gate of the first memory transistor, and the gate of the second memory transistor, and a control section of controlling the switch circuit corresponding to the memory cell so that: when the first type data is to be written into the memory cell, the first wire line is connected to the gate of the first memory transistor and the source of the second memory transistor and the second wire line is connected to the gate of the second memory transistor and the source of the first memory transistor; and when the second type data is to be written into the memory cell, the first wire line is connected to the gate of the second memory transistor and the source of the first memory transistor and the second wire line is connected to the gate of the first memory transistor and the source of the second memory transistor.

The switch section may further comprise a plurality of switch control lines extending in a column direction on a corresponding column, and connected to a plurality of the switch circuits belonging to the corresponding column. The control section may control, during the data write operation, the switch circuit belonging to the memory cell into which the first type data is to be written, via the switch control line to which the switch circuit is connected, so that the first wire line is connected to the gate of the first memory transistor and the source of the second memory transistor and the second wire line is connected to the gate of the second memory transistor and the source of the first memory transistor; and the switch circuit belonging to the memory cell into which the second type data is to be written, via the switch control line to which the switch circuit is connected, so that the first wire line is connected to the gate of the second memory transistor and the source of the first memory transistor and the second wire line is connected to the gate of the first memory transistor and the source of the second memory transistor.

The non-volatile semiconductor memory device may further comprise a selection section of applying the first voltage to all of the first wire lines and the second voltage to all of the second wire line when data is to be written into the memory cell. The switch section may comprise a plurality of first switch elements of switching a conductive state and an interrupted state of a connection between the source of the respective first memory transistors and the switch circuit, a plurality of second switch elements of switching a conductive state and an interrupted state of a connection between the gate of the respective first memory transistors and the switch circuit, a plurality of third switch elements of switching a conductive state and an interrupted state of a connection between the source of the respective second memory transistors and the switch circuit, a plurality of fourth switch elements of switching a conductive state and an interrupted state of a connection between the gate of the respective second memory transistors and the switch circuit, a plurality of first control lines extending in the row direction on the respective rows and connected to the first switch elements belonging the respective rows and the respective third switch elements, a plurality of second control lines extending in the row direction on the respective rows and connected to the second switch elements belonging the respective rows and the respective fourth switch elements, and a control line selection section of controlling a conductive state and an interrupted state of each of the first, second, third and fourth switch elements. During the data write operation, the control line selection section may control the first, second, third and fourth switch elements of the memory cell into which data is to be written to be in the conductive state via the first control line and the second control line provided on a row to which said memory cell into which data is to be written belongs.

When data is to be written into the memory cell, the selection section may apply the first voltage to only the first wire line provided on a row to which the memory cell into which the data is to be written belongs, and the second voltage to only the second wire line which is paired with said first wire line.

When data is to be read from the memory cell, the selection section may apply a third voltage to the first and second wire lines provided on a row to which the memory cell from which the data is to be read is provided. The differential amplifier circuit may determine the data based on a drain current of the first memory transistor and a drain current of the second memory transistor when the selection section applies the third voltage.

The switch section may comprise a plurality of first switch elements of switching a conductive state and an interrupted state of a connection between the source of the respective first memory transistors and the switch circuit, a plurality of second switch elements of switching a conductive state and an interrupted state of a connection between the gate of the respective first memory transistors and the switch circuit, a plurality of third switch elements of switching a conductive state and an interrupted state of a connection between the source of the respective second memory transistors and the switch circuit, a plurality of fourth switch elements of switching a conductive state and an interrupted state of a connection between the gate of the respective second memory transistors and the switch circuit, a plurality of first control lines extending in the column direction on the respective columns and connected to the first switch elements belonging the respective columns and the respective third switch elements, a plurality of second control lines extending in the row direction on the respective rows and connected to the second switch elements belonging the respective rows and the respective fourth switch elements, and a control line selection section of controlling a conductive state and an interrupted state of each of the first, second, third and fourth switch elements. During the data write operation, the control line selection section may control the first, second, third and fourth switch elements of the memory cell from which data is to be read to be in the conductive state via the first control line on a column to which said memory cell from which data is to be read belongs and the second control line provided on a row to which said memory cell from which data is to be read belongs.

Each of the switch circuit can cause connections of the source of the first memory transistor, the source of the second memory transistor, the gate of the first memory transistor, and the gate of the second memory transistor to be the interrupted state. When data is to be read from the memory cell, the control section may cause the switch circuit to interrupt the connections of the source of the first memory transistor, the source of the second memory transistor, the gate of the first memory transistor, and the gate of the second memory transistor on columns on which the memory cells from data is not to be read are provided.

The floating gates of the first and second memory transistors may be provided on a semiconductor substrate of the memory cell. The first and second memory transistors may comprise a diffusion layer provided on a surface of the semiconductor substrate, the floating gate being interposed between the diffusion layer and the surface of the semiconductor substrate, and a control gate provided on the surface of the semiconductor substrate, contacting the floating gate.

When the first type data is to be written into the memory cell, electrons may be injected into the floating gate of the first memory transistor, while electrons may be ejected from the floating gate of the second memory transistor. When the second type data is to be written into the memory cell, electrons may be ejected from the floating gate of the first memory transistor, while electrons may be injected into the floating gate of the second memory transistor.

A threshold of each of the first and second memory transistors may converges to a predetermined threshold when left as it is. Each of the first and second memory transistors may have a structure such that the predetermined threshold is substantially equal to the third voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram illustrating an exemplary device structure of a memory transistor;

DESCRIPTION OF THE PREFERRED EMBODIMENTS (First embodiment)

Figure 1:
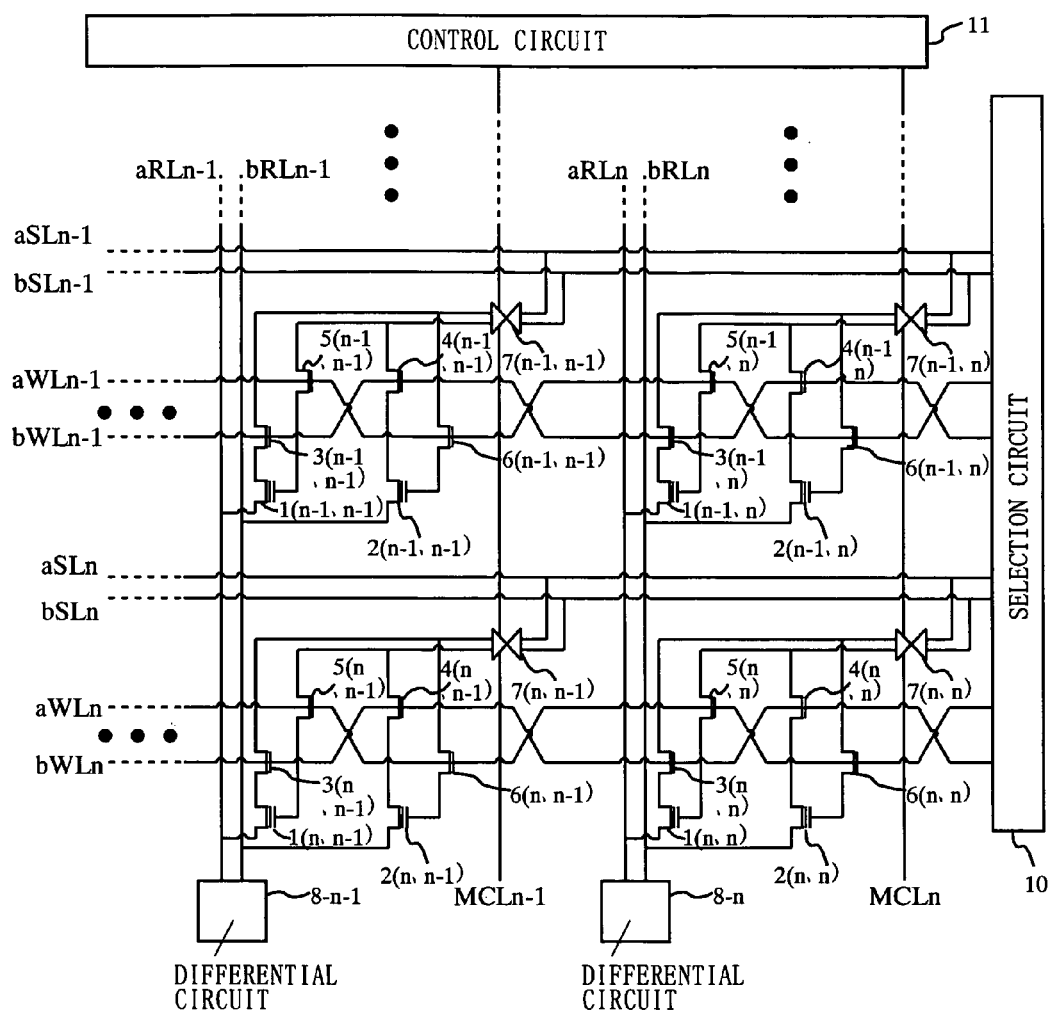
FIG. 1 is a diagram illustrating a structure of a non-volatile semiconductor memory device according to a first embodiment of the present invention.

Hereinafter, a non-volatile semiconductor memory device according to a first embodiment of the present invention will be described with reference to the accompanying drawings. FIG. 1 is a diagram illustrating a structure of a non-volatile semiconductor memory device according to the first embodiment of the present invention. In the non-volatile semiconductor memory device of FIG. 1, memory cells are arranged in a matrix of n×n (n is a natural number). Note that FIG. 1 illustrates an extracted portion of the non-volatile semiconductor memory device.

The non-volatile semiconductor memory device of FIG. 1 comprises memory cells, source lines aSL1 to aSLn, source lines bSL1 to bSLn, word lines aWL1 to aWLn, word lines bWL1 to bWLn, lead lines aRL1 to aRLn, lead lines bRL1 to bRLn, multiplexer control lines MCL1 to MCLn, differential circuits 8-1 to 8-n, a selection circuit 10, and a control circuit 11. The number of the memory cells is n×n. Each memory cell includes a memory transistor 1, a memory transistor 2, a transistor 3, a transistor 4, a transistor 5, a transistor 6, and a multiplexer 7. The non-volatile semiconductor memory device of the first example employs two memory transistors to store one-bit data, and can rewrite data without an erase operation. Hereinafter, a connection between each component will be described.

The source lines aSL1 to aSLn and bSL1 to bSLn are wire lines which extend in a row direction and are paired on a row-by-row basis. Similarly, the word lines aWL1 to aWLn and bWL1 to bWLn are wire lines which extend in a row direction and are paired on a row-by-row basis. The source lines aSL1 to aSLn and bSL1 to bSLn and the word lines aWL1 to aWLn and bWL1 to bWLn are all connected to the selection circuit 10. The lead lines aRL1 to aRLn and bRL1 to bRLn are wire lines which extend in a column direction and are paired on a column-by-column basis. The lead lines aRL1 to aRLn and bRL1 to bRLn are connected to the differential circuits 8-1 to 8-n which are provided on the respective columns. The multiplexer control lines MCL1 to MCLn are wire lines which extend in the column direction and are connected to the control circuit 11.

Next, a connection between each memory cell will be described. As an example, a memory cell on the (n−1)-th row and the (n−1)-th column will be described.

The drain of the memory transistor 1(n−1, n−1) is connected to the lead line aRLn−1. The source of the memory transistor 1(n−1, n−1) is connected to the drain of the transistor 3(n−1, n−1). The gate of the memory transistor 1(n−1, n−1) is connected to the drain of the transistor 5(n−1, n−1).

The drain of the memory transistor 2(n−1, n−1) is connected to the lead line bRLn−1. The source of the memory transistor 2(n−1, n−1) is connected to the drain of the transistor 4(n−1, n−1). The gate of the memory transistor 2(n−1, n−1) is connected to the drain of the transistor 6(n−1, n−1).

The source of the transistor 3(n−1, n−1) is connected to the multiplexer 7(n−1, n−1). The gate of the transistor 3(n−1, n−1) is connected to the word line bWL(n−1, n−1). The source of the transistor 4(n−1, n−1) is connected to the multiplexer 7(n−1, n−1). The gate of the transistor 4(n−1, n−1) is connected to the word line bWL(n−1, n−1).

The source of the transistor 5(n−1, n−1) is connected to the multiplexer 7(n−1, n−1). The gate of the transistor 5(n−1, n−1) is connected to the word line aWLn−1. The source of the transistor 6(n−1, n−1) is connected to the multiplexer 7(n−1, n−1). The gate of the transistor 6(n−1, n−1) is connected to the word line aWLn−1. The input side of the multiplexer 7(n−1, n−1) is connected to the source lines aSLn−1 and bSLn−1. Note that the other memory cells have a similar connection.

Hereinafter, a role of each component of the non-volatile semiconductor memory device of the first embodiment will be described. The memory transistors 1 and 2 are MOS transistors having a floating gate, which have a property such that the threshold voltage varies depending on the amount of electrons accumulated in the floating gate. A pair of the memory transistors 1 and 2 utilizes such a property to store one-bit data. To write data "1", electrons are ejected from the floating gate of the memory transistor 1, while electrons are injected into the floating gate of the memory transistor 2. On the other hand, to write data "0", electrons are injected into the floating gate of the memory transistor 1, while electrons are ejected from the floating gate of the memory transistor 2.

The source lines aSL and bSL are wire lines which supply a voltage for a data write or read operation with respect to the memory transistors 1 and 2.

The transistors 3 to 6, the multiplexer 7, the selection circuit 10, the control circuit 11, the word lines aWL and bWL, and the multiplexer control line MCL constitute a circuit for switching connections of the source lines aSL and bSL and the memory transistors 1 and 2, depending on the data write or read operation. The transistor 3 plays a role in switching a conductive state and an interrupted state between the multiplexer 7 and the source of the memory transistor 1. The transistor 4 plays a role in switching a conductive state and an interrupted state between the multiplexer 7 and the source of the memory transistor 2. The transistor 5 plays a role in switching a conductive state and an interrupted state between the multiplexer 7 and the gate of the memory transistor 1. The transistor 6 plays a role in switching a conductive state and an interrupted state between the multiplexer 7 and the gate of the memory transistor 2.

The word line aWL is used to apply a voltage supplied from the selection circuit 10 to the gates of the transistors 5 and 6 to switch the conductive state and the interrupted state of the transistors 5 and 6. The word line bWL is used to apply a voltage supplied from the selection circuit 10 to the gates of the transistors 3 and 4 to switch the conductive state and the interrupted state of the transistors 3 and 4. The multiplexer control line MCL is used to apply a voltage supplied from the control circuit 11 to the multiplexer 7 to control an operation of the multiplexer 7.

In response to the voltage applied from the multiplexer control line MCL, the multiplexer 7 switches connections of the source lines aSL and bSL and the memory transistors 1 and 2. Specifically, when a relatively high voltage (hereinafter referred to as an H voltage) is applied to the multiplexer control line MCL, the multiplexer 7 connects the source of the memory transistor 1 and the gate of the memory transistor 2 to the source line aSL, and the gate of the memory transistor 1 and the source of the memory transistor 2 to the source line bSL (hereinafter the connection is referred to as a parallel connection). On the other hand, when a relatively low voltage (hereinafter referred to as an L voltage) is applied to the multiplexer control line MCL, the multiplexer 7 connects the gate of the memory transistor 1 and the source of the memory transistor 2 to the source line aSL, and the source of the memory transistor 1 and the gate of the memory transistor 2 to the source line bSL (hereinafter the connection is referred to as a cross connection).

The selection circuit 10 applies a predetermined voltage to the source lines aSL and bSL and the word lines aWL and bWL, depending on the operation. Specifically, during a data write operation, the selection circuit 10 applies a voltage of 5 V to all of the source lines aSL, a voltage of 0 V to all of the source lines bSL, and a voltage of 1.5 V to the word lines aWL and bWL which are used for writing of data. During a data read operation, the selection circuit 10 applies a voltage of 1.5 V to all of the source lines aSL and bSL, and a voltage of 1.5 V to the word lines aWL and bWL on a row from which data is to be read.

The control circuit 11 applies a predetermined voltage to the multiplexer control line MCL, depending on the operation. Specifically, the control circuit 11 applies the H voltage to the multiplexer control line MCL provided on a column which has a memory cell into which data "1" is to be written, and the L voltage to the multiplexer control line MCL on a column having a memory cell into which data "0" is to be written. During a read operation, the control circuit 11 applies the H voltage to all of the multiplexer control lines MCL.

During a data read operation, the differential circuit 8 compares drain currents of the memory transistors 1 and 2 of a memory cell from which the data is read, to determine the data.

An operation of the thus-constructed non-volatile semiconductor memory device according to the first embodiment of the present invention will be hereinafter described. Note that the non-volatile semiconductor memory device performs a write operation and a read operation. Firstly, the write operation will be described.

The write operation is an operation during which data are simultaneously written into memory cells on a row. In the following description, as an example of the write operation, data is now assumed to be written into memory cells on the n-th row. It is also now assumed that data "0" is written into a memory cell on the n-th row and the (n−1)-th column, while data "1" is written into a memory cell on the n-th row and the n-th column.

During the write operation, the selection circuit 10 applies a voltage of 5 V to all of the source lines aSL and a voltage of 0 V to all of the source lines bSL. At the same time, the selection circuit 10 applies a voltage of 1.5 V to the word lines aWLn and bWLn on a row on which a memory cell into which data is to be written is provided, and a voltage of 0 V to the remaining word lines aWL and bWL.

Further, the control circuit 11 applies the H voltage to the multiplexer control line MCL on which a memory cell into which data "1" is to be written is provided, and the L voltage to the multiplexer control line MCL on which a memory cell into which data "0" is to be written is provided. Specifically, the control circuit 11 applies the L voltage to the multiplexer control line MCLn−1, and the H voltage to the multiplexer control line MCLn.

The above-described voltage application causes the multiplexer 7(n, n−1) to be in the cross connection state, and the multiplexer 7(n, n) to be in the parallel connection state. Also, the transistor 3(n, n−1), the transistor 4(n, n−1), the transistor 5(n, n−1), the transistor 6(n, n−1), the transistor 3(n, n), the transistor 4(n, n), the transistor 5(n, n), and the transistor 6(n, n) are caused to be in the conductive state. As a result, a voltage of 0 V is applied to the source of the memory transistor 1(n, n−1), while a voltage of 5 V is applied to the gate of the memory transistor 1(n, n−1). Therefore, when electrons have not been injected in the floating gate of the memory transistor 1(n, n−1), Fowler-Nordheim current occurs, so that electrons are injected from the source or the substrate into the floating gate. A voltage of 5 V is applied to the source of the memory transistor 2(n, n−1), while a voltage of 0 V is applied to the gate of the memory transistor 2(n, n−1). Thereby, when electrons have been injected in the floating gate of the memory transistor 2(n, n−1), the potential of the source induces and generates Fowler-Nordheim current, so that electrons are ejected from the floating gate. A voltage of 5 V is applied to the source of the memory transistor 1(n, n), while a voltage of 0 V is applied to the gate of the memory transistor 1(n, n). Thereby, when electrons have been injected in the floating gate of the memory transistor 1(n, n), the potential of the source induces and generates Fowler-Nordheim current, so that electrons are ejected from the floating gate. A voltage of 0 V is applied to the source of the memory transistor 2(n, n), while a voltage of 5 V is applied to the gate of the memory transistor 2(n, n). Thereby, when electrons have not been injected in the floating gate of the memory transistor 2(n, n), Fowler-Nordheim current occurs, so that electrons are injected into the floating gate via the source or the substrate. In this manner, data "0" is written into the memory cell on the n-th row and the (n−1)-th column, while data "1" is written into the memory cell on the n-th row and the n-th column.

Next, the data read operation will be described. During the data read operation, data corresponding to one row is read out into the differential circuits 8-1 to 8-n. As an example of the read operation, data is now assumed to be read from the n-th row. It is also now assumed that data "0" is stored in the memory cell on the n-th row and the (n−1)-th column, while data "1" is stored in the memory on the n-th row and the n-th column.

During the read operation, the selection circuit 10 applies a voltage of 1.5 V to all of the source lines aSL and bSL. At the same time, the selection circuit 10 applies a voltage of 1.5 V to the word lines aWLn and bWLn on a row on which a memory cell into which data is to be written is provided, while a voltage of 0 V is applied to the remaining word lines aWL and bWL. Further, the control circuit 11 applies to the H voltage to all of the multiplexer control lines MCL.

The above-described voltage application causes all of the multiplexers 7 to be in the parallel connection state. Further, the transistor 3(n, n−1), the transistor 4(n, n−1), the transistor 5(n, n−1), the transistor 6(n, n−1), the transistor 3(n, n), the transistor 4(n, n), the transistor 5(n, n), and the transistor 6(n, n) are caused to be in the conductive state. As a result, a voltage of 1.5 V is applied to the source and gate of the memory transistor 1(n, n−1). A voltage of 1.5 V is applied to the source and gate of the memory transistor 2(n, n−1). A voltage of 1.5 V is applied to the source and gate of the memory transistor 1(n, n). A voltage of 1.5 V is applied to the source and gate of the memory transistor 2(n, n).

According to the assumption, data "0" is stored in the memory cell on the n-th row and the (n−1)-th column. Therefore, electrons have been injected in the floating gate of the memory transistor 1(n−1, n), while electrons have not been injected in the floating gate of the memory transistor 2(n−1, n). Therefore, a current flowing through the lead line aRLn−1 is smaller than a current flowing through the lead line bRLn−1. The differential circuit 8-n-1 compares these currents to determine the data. In this case, the differential circuit 8-n-1 determines that the read data is data "0".

According to the assumption, data "1" is assumed to be stored in the memory cell on the n-th row and the n-th column. Therefore, electrons have not been injected in the floating gate of the memory transistor 1(n, n), while electrons have been injected in the floating gate of the memory transistor 2(n, n). Therefore, a current flowing through the lead line aRLn is larger than a current flowing through the lead line bRLn. The differential circuit 8-n compares these currents to determine the data. In this case, the differential circuit 8-n determines that the read data is data "1". In this manner, data is read from the n-th row.

As described above, according to the non-volatile semiconductor memory device of the first embodiment of the present invention, it is not necessary to perform an erase operation before a data write operation, so that the speed of writing data can be increased. Details thereof will be hereinafter described.

Figure 10:
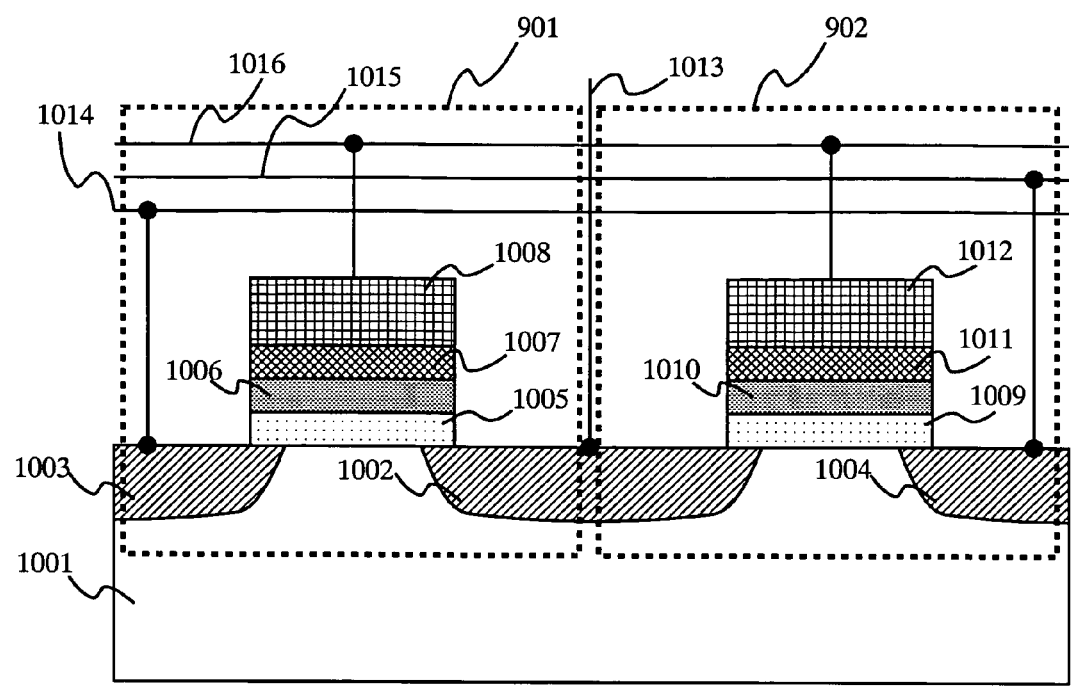
FIG. 10 is a diagram illustrating a structure of a conventional non-volatile semiconductor memory device.

In the conventional non-volatile semiconductor memory device of FIG. 10, the gate of the Nch transistor 901 and the gate of the Nch transistor 902 are connected to the common word line 1016. Therefore, in this non-volatile semiconductor memory device, different voltages cannot be applied to the two gates of these transistors. As a result, electrons are injected into only one of the floating gate 1006 of the Nch transistor 901 and the floating gate 1010 of the Nch transistor 902, while electrons are ejected from only the other. Therefore, in the non-volatile semiconductor memory device, an erase operation needs to be performed to eject accumulated electrons from the floating gate 1006 or the floating gate 1010 before rewriting of data.

In contrast, according to the non-volatile semiconductor memory device of the first embodiment of the present invention, the gate of the memory transistor 1 and the gate of the memory transistor 2 are not connected to the same word line. In addition, during the write operation, the multiplexer 7 is employed so that the same voltage is applied to the gate of the memory transistor 1 and the source of the memory transistor 2, while the same voltage is applied to the gate of the memory transistor 2 and the source of the memory transistor 1. Therefore, in the non-volatile semiconductor memory device, electrons can be injected into one of the floating gate of the memory transistor 1 and the floating gate of the memory transistor 2 while electrons are ejected from the other. Although an erase operation and a write operation are separately performed, i.e., two steps are required in conventional techniques, the erase operation and the write operation can be performed in a single step in the first embodiment of the present invention. Therefore, in the non-volatile semiconductor memory device according to the first embodiment of the present invention, a time required to rewrite data can be reduced.

Further, according to the non-volatile semiconductor memory device of the first embodiment of the present invention, since the erase operation and the write operation are performed in a single step, the write operation of the non-volatile semiconductor memory device can be simplified.

Furthermore, according to the non-volatile semiconductor memory device of the first embodiment of the present invention, electrons are injected into one of two memory transistors, while electrons are ejected from the other memory transistor. During the read operation, the non-volatile semiconductor memory device compares currents read from the two memory transistors. Therefore, in the non-volatile semiconductor memory device, the difference between the two currents for determination of data can be made larger than when a current generated by a reference voltage is compared with a current read from a memory transistor. As a result, erroneous data read is less likely to occur.

(Second embodiment)

Figure 2:
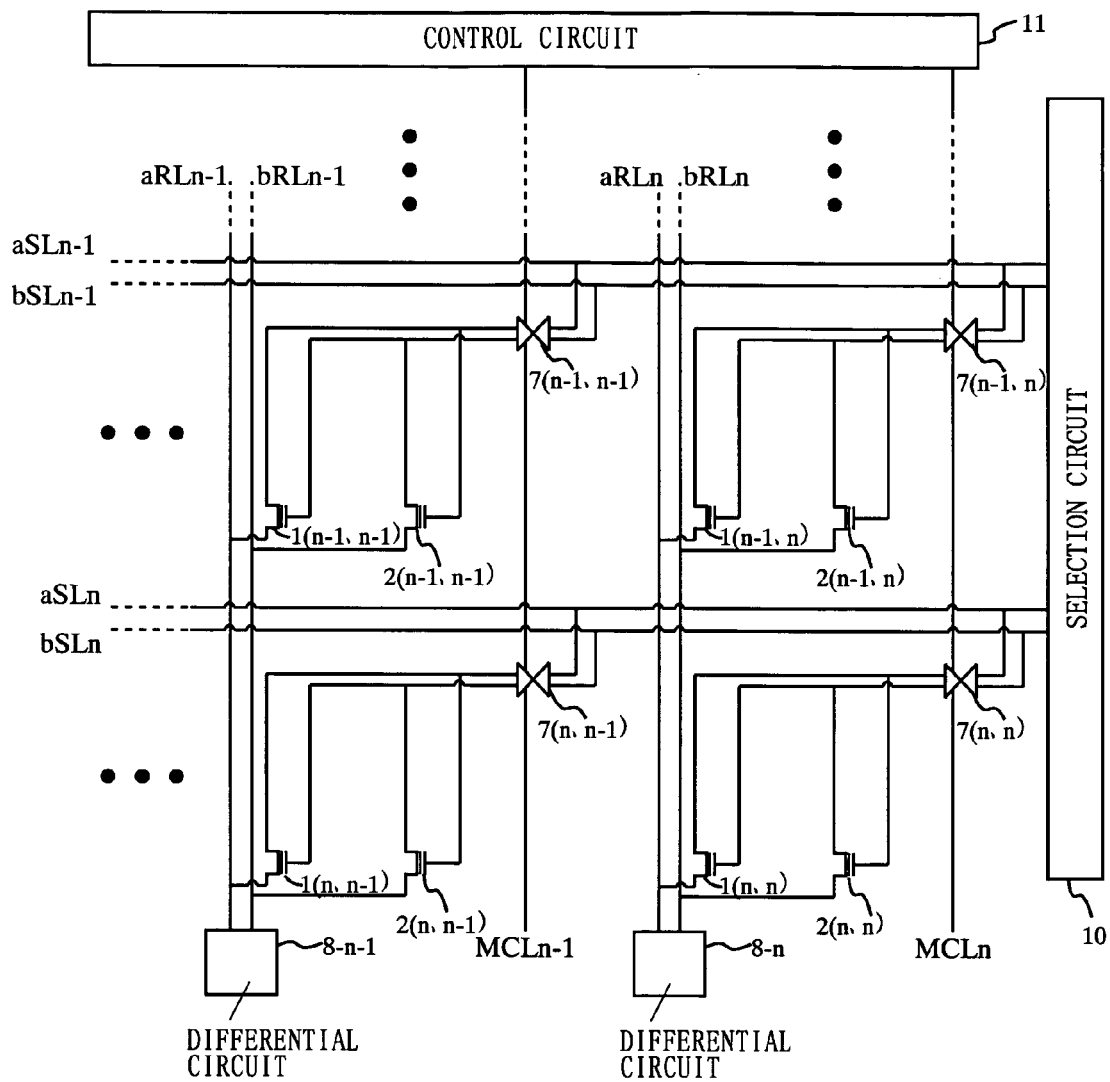
FIG. 2 is a diagram illustrating a structure of a non-volatile semiconductor memory device according to a second embodiment of the present invention.

Hereinafter, a non-volatile semiconductor memory device according to a second embodiment of the present invention will be described with reference to the accompanying drawings. FIG. 2 is a diagram illustrating a structure of the non-volatile semiconductor memory device of the second embodiment of the present invention. In the non-volatile semiconductor memory device of FIG. 2, memory cells are arranged in a matrix of n×n (n is a natural number). FIG. 2 illustrates an extracted portion of the non-volatile semiconductor memory device.

The non-volatile semiconductor memory device of FIG. 2 comprises memory cells, source lines aSL1 to aSLn, source lines bSL1 to bSLn, lead lines aRL1 to aRLn, lead lines bRL1 to bRLn, multiplexer control lines MCL1 to MCLn, differential circuits 8-1 to 8-n, a selection circuit 10, and a control circuit 11. The number of the memory cells is n×n, each of which comprises a memory transistor 1, a memory transistor 2 and a multiplexer 7.

The non-volatile semiconductor memory device of the second embodiment of the present invention is different from that of the first embodiment in that the transistors 3 to 6 and the word lines aWL and bWL are not used, and in an operation of the selection circuit 10. Hereinafter, a connection between each component will be described.

Connections of the source lines aSL and bSL1 to bSLn, the lead lines aRL and bRL, the multiplexer control lines MCL, the differential circuits 8, the control circuit 11 and the selection circuit 10 are similar to those of the first embodiment and will not be explained. Hereinafter, connections inside a memory cell will be described. As an example of the memory cell, the memory cell on the (n−1)-th row and the (n−1)-th column will be described.

The drain of the memory transistor 1(n−1, n−1) is connected to the lead line aRLn−1. The source of the memory transistor 1(n−1, n−1) is connected to an output side of the multiplexer 7(n−1, n−1). The gate of the memory transistor 1(n−1, n−1) is connected to the output side of the multiplexer 7(n−1, n−1).

The drain of the memory transistor 2(n−1, n−1) is connected to the lead line bRLn−1. The source of the memory transistor 2(n−1, n−1) and the gate of the memory transistor 1(n−1, n−1) are connected to the output side of the multiplexer 7(n−1, n−1). The gate of the memory transistor 2(n−1, n−1) and the source of the memory transistor 1(n−1, n−1) are connected to the output side of the multiplexer 7(n−1, n−1).

A role of each component of the non-volatile semiconductor memory device of the second embodiment of the present invention will be described. The roles of the source lines aSL and bSL, the lead lines aRL and bRL, the multiplexer control lines MCL, the multiplexers 7, the differential circuits 8 and the control circuit 11 are similar to those of the first embodiment and will not be explained.

The memory transistors 1 and 2 are MOS transistors having a floating gate and a property such that a threshold voltage varies depending on the amount of electrons accumulated in the floating gate. The memory transistors 1 and 2 each store one-bit data using the property. In order to write data "1", electrons are ejected from the floating gate of the memory transistor 1, while electrons are injected into the floating gate of the memory transistor 2. In order to write data "0", electrons are injected into the floating gate of the memory transistor 1, while electrons are ejected from the floating gate of the memory transistor 2.

The selection circuit 10 applies a predetermined voltage to the source lines aSL and bSL, depending on the operation. Specifically, during the data write operation, the selection circuit 10 applies a voltage of 5 V to only the source line aSL on a row on which a memory cell into which data is to be written is provided, a voltage of 0 V to the remaining source lines aSL, and a voltage of 0 V to all of the source lines bSL. During the data read operation, the selection circuit 10 applies a voltage of 1.5 V to the source lines aSL and bSL on a row on which a memory cell from which data is to be read is provided, and a voltage of 0 V to the remaining source lines aSL and bSL.

An operation of the thus-constructed non-volatile semiconductor memory device of the second embodiment of the present invention will be hereinafter described. Note that the non-volatile semiconductor memory device performs a write operation and a read operation. Firstly, the write operation will be described.

The write operation is an operation which simultaneously writes data into memory cells on a row. In the following description, as an example of the write operation, data is now assumed to be written into memory cells provided on the n-th row. Specifically, it is also now assumed that data "0" is written into a memory cell on the (n−1)-th column, while data "1" is written into a memory cell on the n-th column.

During the write operation, the selection circuit 10 applies to a voltage of 5 V to the source line aSLn on a row on which a memory cell into which data is to be written is provided, and a voltage of 0 V to the remaining source lines aSL and all of the source lines bSL.

Further, the control circuit 11 applies the H voltage to the multiplexer control line MCL on a column on which a memory cell into which data "1" is to be written is provided, and the L voltage to the multiplexer control line MCL on which a memory cell into which data "0" is to be written is provided. Specifically, the control circuit 11 applies to the L voltage to the multiplexer control line MCLn−1, and the H voltage to the multiplexer control line MCLn.

As described above, the application of the voltage causes the multiplexer 7(n, n−1) to be in the cross connection state. Further, the multiplexer 7(n, n) is caused to be in the parallel connection. As a result, a voltage of 0 V is applied to the source of the memory transistor 1(n, n−1), while a voltage of 5 V is applied to the gate of the memory transistor 1(n, n−1). Thereby, when electrons have not been injected in the floating gate of the memory transistor 1(n, n−1), Fowler-Nordheim current occurs, so that electrons are injected into the floating gate via the source or the substrate. A voltage of 5 V is applied to the source of the memory transistor 2(n, n−1), while a voltage of 0 V is applied to the gate of the memory transistor 2(n, n−1). Thereby, when electrons have been injected in the floating gate of the memory transistor 2(n, n−1), the potential of the source induces and generates Fowler-Nordheim current, so that electrons are ejected from the floating gate. A voltage of 5 V is injected to the source of the memory transistor 1(n, n), while a voltage of 0 V is applied to the gate of the memory transistor 1(n, n). Thereby, when electrons have been injected in the floating gate of the memory transistor 1(n, n), the potential of the source induces and generates Fowler-Nordheim current, so that electrons are ejected from the floating gate. A voltage of 0 V is applied to the source of the memory transistor 2(n, n), while a voltage of 5 V is applied to the gate of the memory transistor 2(n, n). Thereby, when electrons have not been injected in the floating gate of the memory transistor 2(n, n), Fowler-Nordheim current occurs, so that electrons are injected into the floating gate via the source or the substrate. In this manner, data "0" is written into the memory cell on the n-th row and the (n−1)-th column, while data "1" is written into the memory cell on the n-th row and the n-th column.

Next, the data read operation will be described. During the data read operation, data corresponding to one row is readout into the differential circuits 8-1 to 8-n. As an example of the read operation, data is now assumed to be read from the n-th row. It is also now assumed that the memory cell on the n-th row and the (n−1)-th column stores data "0", while the memory cell on the n-th row and the n-th column stores data "1".

During the read operation, the selection circuit 10 applies a voltage of 1.5 V to the source lines aSLn and bSLn on a row on which a memory cell from which data is to be read is provided, and a voltage of 0 V to the remaining source lines aSL and bSL. Further, the control circuit 11 applies the H voltage to all of the multiplexer control lines MCL.

The above-described voltage application causes all of the multiplexers 7 to be in the parallel connection. As a result, a voltage of 1.5 V is applied to the source and gate of the memory transistor 1(n, n−1). A voltage of 1.5 V is applied to the source and gate of the memory transistor 2(n, n−1). A voltage of 1.5 V is applied to the source and gate of the memory transistor 1(n, n). A voltage of 1.5 V is applied to the source and gate of the memory transistor 2(n, n).

According to the assumption, data "0" is stored in the memory cell on the n-th row and the (n−1)-th column. Therefore, electrons have been injected in the floating gate of the memory transistor 1(n, n−1), while electrons have not been injected in the floating gate of the memory transistor 2(n, n−1). Therefore, a current flowing through the lead line aRLn−1 is smaller than a current flowing through the lead line bRLn−1. The differential circuit 8-n−1 compares these currents to determine the data. In this case, the differential circuit 8-n−1 determines that the read data is data "0".

Also, data "1" is stored in the memory cell on the n-th row and the n-th column. Therefore, electrons have not been injected in the floating gate of the memory transistor 1(n, n), while electrons have been injected in the floating gate of the memory transistor 2(n, n). Therefore, a current flowing through the lead line aRLn is larger than a current flowing through the lead line bRLn. The differential circuit 8-n compares these currents to determine the data. In this case, the differential circuit 8-n determines that the read data is data "1". In this manner, data is read from the n-th row.

As described above, according to the non-volatile semiconductor memory device of the second embodiment of the present invention, it is not necessary to perform an erase operation before a data write operation as in the non-volatile semiconductor memory device of the first embodiment. Thereby, it is possible to increase the speed of writing data.

Further, in the non-volatile semiconductor memory device of the second embodiment of the present invention, an erase operation and a write operation are performed in a single step as in the non-volatile semiconductor memory device of the first embodiment, thereby making it possible to simplify the write operation of the non-volatile semiconductor memory device.

According to the non-volatile semiconductor memory device of the second embodiment, erroneous data read is less likely to occur as in the non-volatile semiconductor memory device of the first embodiment.

According to the non-volatile semiconductor memory device of the second embodiment, during the write operation and the read operation, a voltage is applied to only the source lines aSL and bSL on a row on which a memory cell into/from which data is to be written/read is provided. As a result, it is possible to reduce the power consumption of the non-volatile semiconductor memory device.

According to the non-volatile semiconductor memory device of the second embodiment, the number of transistors provided in each memory cell is smaller than that of the first embodiment. As a result, the circuit scale of the non-volatile semiconductor memory device can be reduced.

In the first and second embodiments, during the read operation, the control circuit 11 applies the H voltage to all of the multiplexer control lines MCL. The method of applying the voltage is not limited to this. Alternatively, during the read operation, the control circuit 11 may apply the L voltage to all of the multiplexer control lines MCL.

(Third embodiment)

Figure 3:
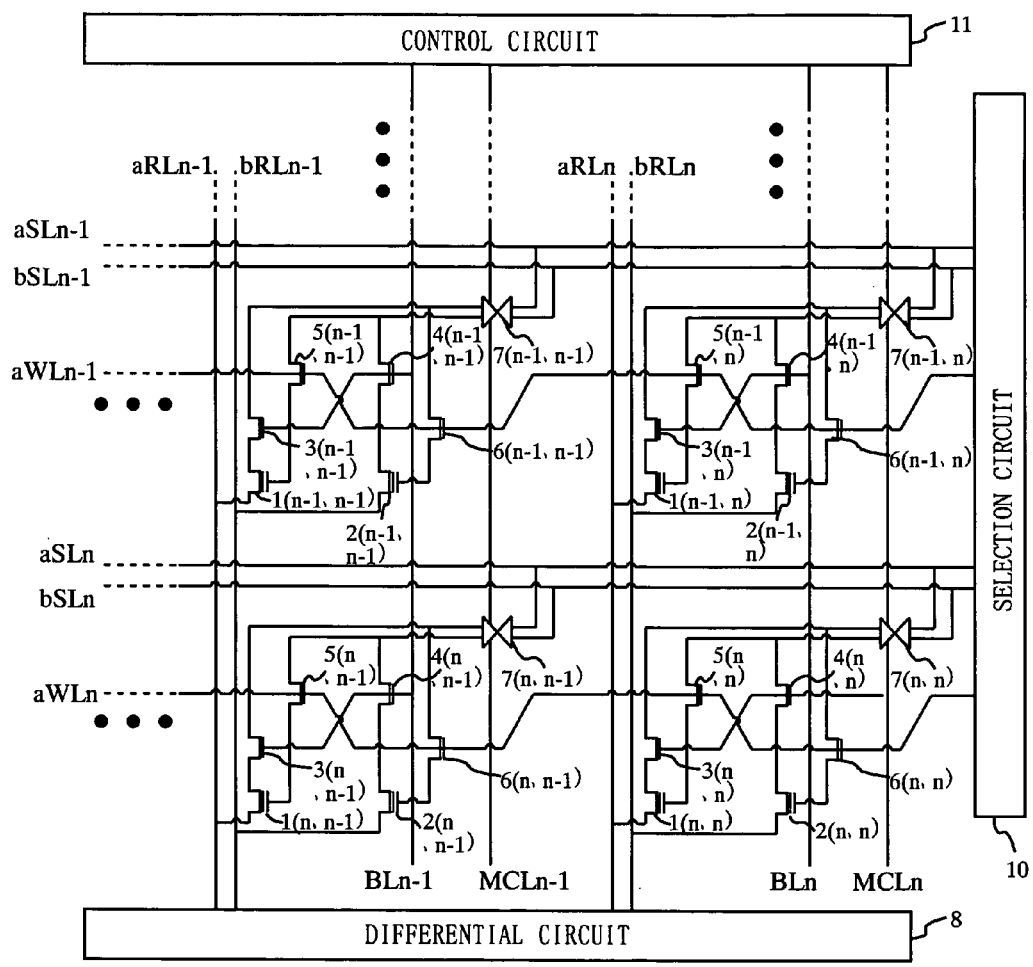
FIG. 3 is a diagram illustrating a structure of a non-volatile semiconductor memory device according to a third embodiment of the present invention.

Hereinafter, a non-volatile semiconductor memory device according to a third embodiment of the present invention will be described with reference to the accompanying drawings. FIG. 3 is a diagram illustrating a structure of the non-volatile semiconductor memory device of the third embodiment of the present invention. In the non-volatile semiconductor memory device of FIG. 3, memory cells are arranged in a matrix of n×n (n is a natural number). FIG. 3 illustrates an extracted portion of the non-volatile semiconductor memory device.

The non-volatile semiconductor memory device of FIG. 3 comprises memory cells, source lines aSL1 to aSLn and bSL1 to bSLn, word lines aWL1 to aWLn, bit lines BL1 to BLn, lead lines aRL1 to aRLn and bRL1 to bRLn, multiplexer control lines MCL1 to MCLn, a differential circuit 8, a selection circuit 10, and a control circuit 11. The number of the memory cells is n×n, each of which comprises a memory transistor 1, a memory transistor 2, a transistor 3, a transistor 4, a transistor 5, a transistor 6, and a multiplexer 7. The non-volatile semiconductor memory device of the third embodiment of the present invention is different from that of the first embodiment in that the bit lines BL1 to BLn are provided instead of the word lines bWL1 to bWLn. Thereby, the non-volatile semiconductor memory device of the third embodiment of the present invention allows data read on a memory cell-by-memory cell basis. Hereinafter, a connection between each component will be described.

Connections of the source lines aSL1 to aSLn and bSL1 to bSLn, the word lines aWL1 to aWLn, the lead lines aRL1 to aRLn and bRL1 to bRLn, the multiplexer control lines MCL1 to MCLn, the selection circuit 10, the memory transistor 1, the memory transistor 2, the transistor 5, the transistor 6, and the multiplexer 7 are similar to those of the first embodiment and will not be explained.

The bit lines BL1 to BLn are provided extending in the column direction on the respective columns, one end of each of which is connected to the control circuit 11. Next, connections of the transistors 3 and 4 will be described. As representatives of the transistors 3 and 4, the transistors 3(n−1, n−1) and 4(n−1, n−1) will be described.

The source of the transistor 3(n−1, n−1) is connected to the multiplexer 7(n−1, n−1). The gate of the transistor 3(n−1, n−1) is connected to the bit line BLn−1. The source of the transistor 4(n−1, n−1) is connected to the multiplexer 7(n−1, n−1). The gate of the transistor 4(n−1, n−1) is connected to the bit line bBLn−1. The drains of the transistors 3(n−1, n−1) and 4(n−1, n−1) are connected to the differential circuit 8.

Hereinafter, a role of each component of the non-volatile semiconductor memory device of the third embodiment of the present invention will be described. Note that the roles of the source lines aSL1 to aSLn, the source lines bSL1 to bSLn, the word lines aWL1 to aWLn, the lead line aRL1 to aRLn, the lead lines bRL1 to bRLn, the multiplexer control line MCL1 to MCLn, the selection circuit 10, the memory transistor 1, the memory transistor 2, the transistor 3, the transistor 4, the transistor 5, the transistor 6, and multiplexer 7 are similar to those of the first embodiment and will not be explained.

The bit line BL switches the conductive and interrupted states of the transistors 3 and 4 provided thereon, depending on the voltage applied by the control circuit 11. During the data read operation, the differential circuit 8 compares drain currents of the memory transistors 1 and 2 of a memory cell from which data is to be read out, to determine the data. Note that the differential circuit 8 is a collection of the differential circuits 8-1 to 8-n described in the first embodiment. The number of differential circuits included in the differential circuit 8 may be smaller than n.

An operation of the thus-constructed non-volatile semiconductor memory device of the third embodiment of the present invention will hereinafter described. Note that the non-volatile semiconductor memory device performs a write operation and a read operation. Firstly, the write operation will be described.

The write operation is an operation which simultaneously writes data into memory cells on a row. Hereinafter, as an example of the write operation, data is now assumed to be written into memory cells provided on the n-th row. It is also assumed that data "0" is written into a memory cell on the (n−1)-th column, while data "1" is written into a memory cell on the n-th column.

During the write operation, the selection circuit 10 applies a voltage of 5 V to all of the source lines aSL, and a voltage of 0 V to all of the source lines bSL. At the same time, the selection circuit 10 applies a voltage of 1.5 V to the word line aWLn on a row on which a memory cell into which data is to be written is provided, and a voltage of 0 V to the remaining word lines aWL.

Further, the control circuit 11 applies the H voltage to the multiplexer control line MCL on a column on which a memory cell into which data "1" is to be written is provided, and the L voltage to the multiplexer control line MCL on a column on a memory cell into which data "0" is to be written is provided. Specifically, the control circuit 11 applies the L voltage to the multiplexer control line MCLn−1, and the H voltage to the multiplexer control line MCLn. Also, the control circuit 11 applies a voltage of 1.5 V to all of the bit lines BL.

The above-described voltage application causes the multiplexer 7(n, n−1) to be in the cross connection state. Also, the multiplexer 7(n, n) is caused to be in the parallel connection state. Also, the transistor 3(n, n−1), the transistor 4(n, n−1), the transistor 5(n, n−1), the transistor 6(n, n−1), the transistor 3(n, n), the transistor 4(n, n), the transistor 5(n, n), and the transistor 6(n, n) are caused to be in the conductive state. As a result, a voltage of 0 V is applied to the source of the memory transistor 1(n, n−1), while a voltage of 5 V is applied to the gate of the memory transistor 1(n, n−1). Thereby, when electrons have not been injected in the floating gate of the memory transistor 1(n, n−1), Fowler-Nordheim current occurs, so that electrons are injected into the floating gate via the source or the substrate. A voltage of 5 V is applied to the source of the memory transistor 2(n, n−1), while a voltage of 0 V is applied to the gate of the memory transistor 2(n, n−1). Thereby, when electrons have been injected in the floating gate of the memory transistor 2(n, n−1), the potential of the source induces and generates Fowler-Nordheim current, so that electrons are ejected from the floating gate. A voltage of 5 V is applied to the source of the memory transistor 1(n, n), while a voltage of 0 V is applied to the gate of the memory transistor 1(n, n). Thereby, when electrons have been injected in the floating gate of the memory transistor 1(n, n), the potential of the source induces and generates Fowler-Nordheim current, so that electrons are ejected from the floating gate. A voltage of 0 V is applied the source of the memory transistor 2(n, n), while a voltage of 5 V is applied to the gate of the memory transistor 2(n, n). Thereby, when electrons have not been injected in the floating gate of the memory transistor 2(n, n), Fowler-Nordheim current occurs, so that electrons are injected into the floating gate via the source or the substrate. In this manner, data "0" is written into the memory cell on the n-th row and the (n−1)-th column, while data "1" is written into the memory cell on the n-th row and the n-th column.

Next, the data read operation will be described. During the read operation of the non-volatile semiconductor memory device of the third embodiment of the present invention, data corresponding to a column is read out into the differential circuit 8. As an example of the read operation, data is now assumed to be read out from the memory cell on the n-th row and the n-th column. It is also assumed that data "1" is stored in the memory cell on the n-th row and the n-th column.

During the read operation, the selection circuit 10 applies a voltage of 1.5 V to all of the source lines aSL and bSL. At the same time, the selection circuit 10 applies a voltage of 1.5 V on the word line aWLn on a row on which a memory cell from which data is to be read is provided, and a voltage of 0 V to the remaining word lines aWL. Further, the control circuit 11 applies the H voltage to all of the multiplexer control lines MCL. Furthermore, the control circuit 11 applies a voltage of 1.5 V to the bit line BLn on a column on which a memory cell from which data is to be read is provided, and a voltage of 0 V to the remaining bit lines BL.

The above-described voltage application causes all of the multiplexers 7 to be in the parallel connection state. Also, the transistor 3(n, n), the transistor 4(n, n), the transistor 5(n, n), and the transistor 6(n, n) are caused to be in the conductive state. As a result, a voltage of 1.5 V is applied to the source and gate of the memory transistor 1(n, n). Also, a voltage of 1.5 V is applied to the source and gate of the memory transistor 2(n, n).

According to the assumption, the memory cell on the n-th row and the n-th column stores data "1". Therefore, electrons have not been injected in the floating gate of the memory transistor 1(n, n), while electrons have been injected in the floating gate of the memory transistor 2(n, n). Therefore, a current flowing through the lead line aRLn is larger than a current flowing through the lead line bRLn. The differential circuit 8 compares these currents to determine the data. In this case, the differential circuit 8 determines that the read data is data "1". In this manner, data is read from the memory cell on the n-th row and the n-th column.

As described above, according to the non-volatile semiconductor memory device of the third embodiment of the present invention, it is not necessary to perform an erase operation before a data write operation as in the non-volatile semiconductor memory device of the first embodiment. Thereby, it is possible to increase the speed of writing data.

Further, according to the non-volatile semiconductor memory device of the third embodiment of the present invention, the erase operation and the write operation are performed in a single step as in the non-volatile semiconductor memory device of the first embodiment. Thereby, the write operation of the non-volatile semiconductor memory device can be simplified.

Furthermore, according to the non-volatile semiconductor memory device of the third embodiment of the present invention, erroneous data read is less likely to occur as in the non-volatile semiconductor memory device of the first embodiment.

Furthermore, according to the non-volatile semiconductor memory device of the third embodiment of the present invention, one of the two word lines which are provided in the row direction in the first embodiment is provided in the column direction as a bit line. Therefore, a memory cell can be selected by selecting one of the word lines and one of the bit lines. As a result, the data read operation can be performed on a memory cell-by-memory cell basis, but not on a row-by-row basis.

As described above, according to the non-volatile semiconductor memory device of the third embodiment of the present invention, data read can be performed on a memory cell-by-memory cell basis, and therefore, at least one differential circuit is only required. As a result, the circuit scale of the non-volatile semiconductor memory device can be reduced.

According to the non-volatile semiconductor memory device of the third embodiment of the present invention, the bit line BL is used instead of the word line bWL of the first embodiment. However, the wire line which is replaced with the bit line BL is not limited to this. For example, the word line aWL of the first embodiment may be replaced with the bit line BL.

(Fourth embodiment)

Figure 4:
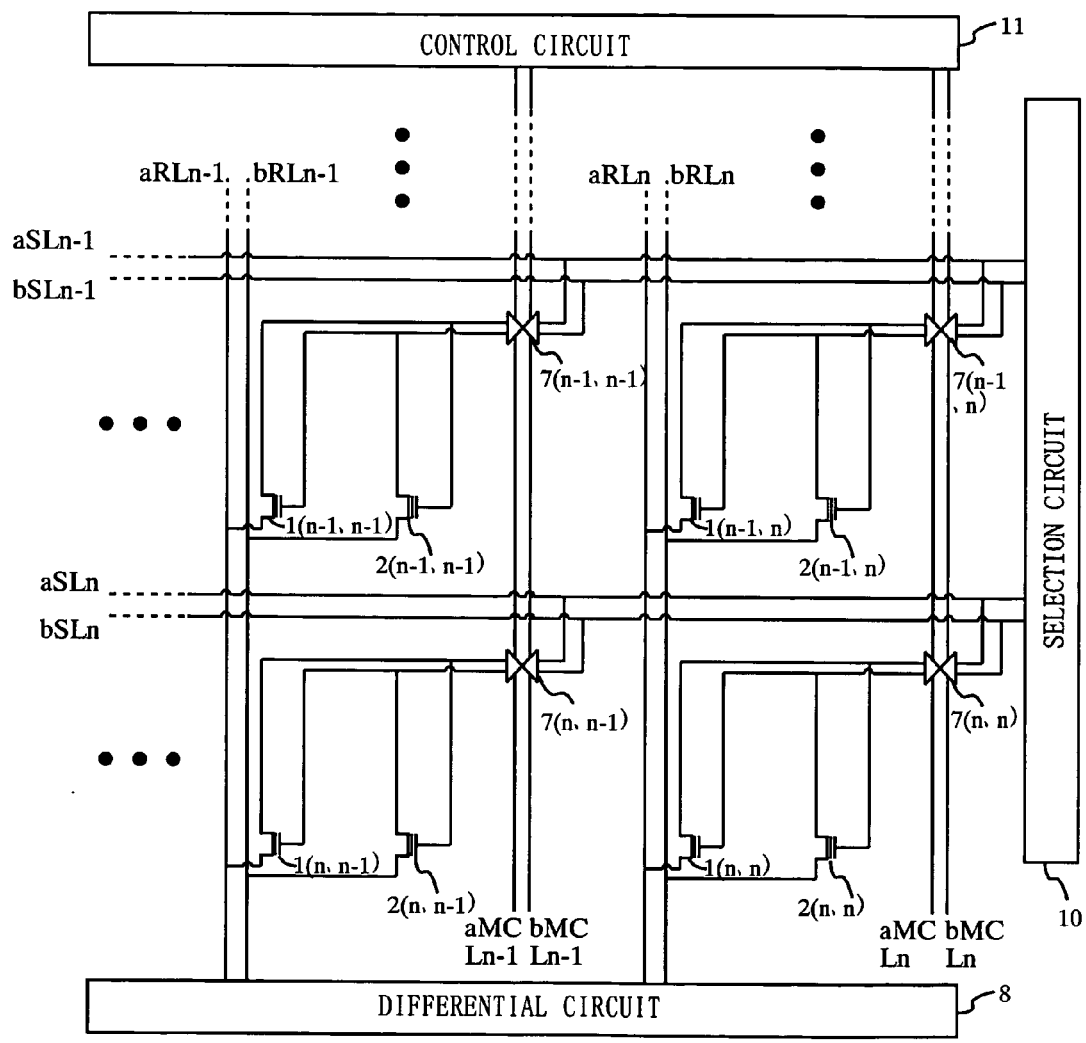
FIG. 4 is a diagram illustrating a structure of a non-volatile semiconductor memory device according to a fourth embodiment of the present invention.

Hereinafter, a non-volatile semiconductor memory device according to a fourth embodiment of the present invention will be described with reference to the accompanying drawings. FIG. 4 is a diagram illustrating a structure of the non-volatile semiconductor memory device of the fourth embodiment the present invention. In the non-volatile semiconductor memory device of FIG. 4, memory cells are arranged in a matrix of n×n (n is a natural number). FIG. 4 illustrates an extracted portion of the non-volatile semiconductor memory device.

The non-volatile semiconductor memory device of FIG. 4 comprises memory cells, source lines aSL1 to aSLn and bSL1 to bSLn, lead lines aRL1 to aRLn and bRL1 to bRLn, multiplexer control lines aMCL1 to aMCLn, multiplexer control lines bMCL1 to bMCLn, a differential circuit 8, a selection circuit 10, and a control circuit 11. The number of the memory cells is n×n, each of which comprises a memory transistor 1, a memory transistor 2, and a multiplexer 7.

The non-volatile semiconductor memory device of the fourth embodiment of the present invention is different from the non-volatile semiconductor memory device of the second embodiment in that the multiplexer control lines aMCL1 to aMCLn and the multiplexer control lines bMCL1 to bMCLn are used instead of the multiplexer control lines MCL1 to MCLn. Further, in the non-volatile semiconductor memory device of the fourth embodiment of the present invention, the multiplexer 7 has an operation different from that of the multiplexer 7 of the second embodiment. Furthermore, whereas the number of the differential circuits 8 is n in the first embodiment, the differential circuits 8 are combined into one section in the non-volatile semiconductor memory device of the fourth embodiment of the present invention. Thereby, in the non-volatile semiconductor memory device of the fourth embodiment of the present invention, data read is performed on a memory cell-by-memory cell basis. Hereinafter, a connection between each component will be described.

Connections of the source lines aSL1 to aSLn and bSL1 to bSLn, the lead line aRL1 to aRLn and bRL1 to bRLn, the selection circuit 10, the memory transistor 1, and the memory transistor 2 are similar to those of the second embodiment and will not be explained.

The multiplexer control lines aMCL1 to aMCLn are provided extending in the column direction on the respective columns. The multiplexer control lines bMCL1 to bMCLn are wire lines which are paired with the multiplexer control lines aMCL1 to aMCLn and extend in the column direction on the respective columns. The multiplexer control lines aMCL1 to aMCLn and the multiplexer control lines bMCL1 to bMCLn are connected to the control circuit 11.

The multiplexer 7 is provided for each memory cell. The multiplexer control line aMCL and the multiplexer control line bMCL on a column on which the multiplexer 7 is provided are connected to the multiplexer 7.

A role of each component of the non-volatile semiconductor memory device of the fourth embodiment of the present invention will be described. The roles of the source lines aSL1 to aSLn and bSL1 to bSLn, the lead lines aRL1 to aRLn and bRL1 to bRLn, the selection circuit 10, the memory transistor 1, and the memory transistor 2 are similar to those of the second embodiment and will not be explained.

The multiplexer 7 switches connections of the source lines aSL and bSL, the memory transistor 1, and the memory transistor 2, depending on the voltage applied via the multiplexer control lines aMCL and bMCL. Specifically, when a relatively high voltage (hereinafter referred to as an H voltage) is applied to the multiplexer control line aMCL and the multiplexer control line bMCL, the multiplexer 7 connects the source of the memory transistor 1 and the gate of the memory transistor 2 to the source line aSL, and the drain of the memory transistor 1 and the source of the memory transistor 2 to the source line bSL (hereinafter this connection is referred to as a parallel connection).

On the other hand, when a relatively low voltage (hereinafter referred to as an L voltage) is applied to the multiplexer control lines aMCL and bMCL, the multiplexer 7 connects the gate of the memory transistor 1 and the source of the memory transistor 2 to the source line aSL, and the source of the memory transistor 1 and the drain of the memory transistor 2 to the source line bSL (hereinafter this connection is referred to as a cross connection). When the H voltage is applied to the multiplexer control line aMCL while the L voltage is applied to the multiplexer control line bMCL, the multiplexer 7 interrupts all wire lines connected thereto (hereinafter this connection state is referred to as interruption).

The control circuit 11 applies a predetermined voltage to the multiplexer control lines aMCL and bMCL, depending on the operation. Specifically, the control circuit 11 applies the H voltage to the multiplexer control lines aMCL and bMCL on a column on which a memory cell into which data "1" is to be written is provided, and the L voltage to the multiplexer control lines aMCL and bMCL on a column on which a memory cell into which data "0" is to be written is provided. During the read operation, the control circuit 11 applies the H voltage to the multiplexer control line aMCL on a column on which a memory cell from which data is to be read is provided, and the L voltage to the remaining multiplexer control lines aMCL and all of the multiplexer control lines bMCL.

During the data read operation, the differential circuit 8 compares drain currents of the memory transistors 1 and 2 in a memory cell from which data is to be read, to determine the data. Note that the differential circuit 8 is a collection of the differential circuits 8-1 to 8-n of the first embodiment. The number of differential circuits included in the differential circuit 8 may be smaller than n.

An operation of the thus-constructed non-volatile semiconductor memory device of the fourth embodiment of the present invention will be described. Note that the non-volatile semiconductor memory device performs a write operation and a read operation. Firstly, the write operation will be described.

The write operation is an operation which simultaneously writes data into memory cells on a row. Hereinafter, as an example of the write operation, data is now assumed to be written into memory cells provided on the n-th row. It is also now assumed that data "0" is written into a memory cell on the (n−1)-th column, while data "1" is written into a memory cell on the n-th column.

During the write operation, the selection circuit 10 applies a voltage of 5 V to the source line aSLn on a row on which a memory cell into which data is to be written is provided, and a voltage of 0 V to the remaining source lines aSL and all of the source lines bSL.

Further, the control circuit 11 applies the H voltage to the multiplexer control lines aMCL and bMCL on a column on which a memory cell into which data "1" is to be written is provided, and the L voltage to the multiplexer control lines aMCL and bMCL on a column on which a memory cell into which data "0" is to be written is provided. Specifically, the control circuit 11 applies the L voltage to the multiplexer control lines aMCLn−1 and bMCLn−1, and the H voltage to the multiplexer control lines aMCLn and bMCLn.

The above-described voltage application causes the multiplexer 7(n, n−1) to be in the cross connection state. Also, the multiplexer 7(n, n) is caused to be in the parallel connection state. As a result, a voltage of 0 V is applied to the source of the memory transistor 1(n, n−1), while a voltage of 5 V is applied to the gate of the memory transistor 1(n, n−1). Thereby, when electrons have not been injected in the floating gate of the memory transistor 1(n, n−1), Fowler-Nordheim current occurs, so that electrons are injected into the floating gate via the source or the substrate. A voltage of 5 V is applied to the source of the memory transistor 2(n, n−1), while a voltage of 0 V is applied to the gate of the memory transistor 2(n, n−1). Thereby, when electrons have been injected in the floating gate of the memory transistor 2(n, n−1), the potential of the source induces and generates Fowler-Nordheim current, so that electrons are ejected from the floating gate. A voltage of 5 V is applied to the source of the memory transistor 1(n, n), while a voltage of 0 V is applied to the gate of the memory transistor 1(n, n). Thereby, when electrons have been injected in the floating gate of the memory transistor 1(n, n), the potential of the source induces and generates Fowler-Nordheim current, so that electrons are ejected from the floating gate. A voltage of 0 V is applied to the source of the memory transistor 2(n, n), while a voltage of 5 V is applied to the gate of the memory transistor 2(n, n). Thereby, when electrons have not been injected in the floating gate of the memory transistor 2(n, n), Fowler-Nordheim current occurs, so that electrons are injected into the floating gate via the source or the substrate. In this manner, data "0" is written into the memory cell on the n-th row and the (n−1)-th column, while data "1" is written into the memory cell on the n-th row and the n-th column.

Next, the data read operation will be described. During the read operation of the non-volatile semiconductor memory device of the fourth embodiment of the present invention, data corresponding to one cell is read out into the differential circuit 8. As an example of the read operation, data is now assumed to be read from the memory cell on the n-th row and the n-th column. It is also now assumed that data "1" is stored in the memory cell on the n-th row and the n-th column.

During the read operation, the selection circuit 10 applies a voltage of 1.5 V to the source lines aSLn and bSLn on a row on which a memory cell from which data is to be read is provided, and a voltage of 0 V to the remaining source lines aSL and bSL. Further, the control circuit 11 applies the H voltage to the multiplexer control lines aMCL and bMCL on a column on which a memory cell from which data is to be read is provided, the H voltage to the remaining multiplexer control lines aMCL, and the L voltage to the remaining multiplexer control lines bMCL.

The above-described voltage application causes the multiplexer 7(n, n) on a column on which a memory cell from which data is to be read is provided, to be in the parallel connection state. On the other hand, the multiplexers 7 other than the multiplexer 7(n, n) are interrupted. As a result, a voltage of 1.5 V is applied to the source and gate of the memory transistor 1(n, n). A voltage of 1.5 V is also applied to the source and gate of the memory transistor 2(n, n).

According to the assumption, the memory cell on the n-th row and the n-th column stores data "1". Therefore, electrons have not been injected in the floating gate of the memory transistor 1(n, n), while electrons have been injected in the floating gate of the memory transistor 2(n, n). Therefore, a current flowing through the lead line aRLn is larger than a current flowing through the lead line bRLn. The differential circuit 8-n compares these currents to determine the data. In this case, the differential circuit 8-n−1 determines that the read data is data "1". In this manner, data is read from the memory cell on the n-th row and the (n−1)-th column.

As described above, according to the non-volatile semiconductor memory device of the fourth embodiment of the present invention, it is not necessary to perform an erase operation before a data write operation as in the non-volatile semiconductor memory device of the first embodiment. Thereby, it is possible to increase the speed of writing data.

According to the non-volatile semiconductor memory device of the fourth embodiment of the present invention, an erase operation and a write operation are performed in a single step as in the non-volatile semiconductor memory device of the first embodiment, thereby making it possible to simplify the write operation of the non-volatile semiconductor memory device.

According to the non-volatile semiconductor memory device of the fourth embodiment of the present invention, erroneous data read is less likely to occur as in the non-volatile semiconductor memory device of the first embodiment.

According to the non-volatile semiconductor memory device of the fourth embodiment of the present invention, during the write operation and the read operation, a voltage is applied to only the source lines aSL and bSL on a row on which a memory cell into/from which data is to be written/read is provided. As a result, it is possible to reduce the power consumption of the non-volatile semiconductor memory device.

According to the non-volatile semiconductor memory device of the fourth embodiment of the present invention, the number of transistors provided in each memory cell is smaller than that of the first embodiment. As a result, the circuit scale of the non-volatile semiconductor memory device can be reduced.

According to the non-volatile semiconductor memory device of the fourth embodiment of the present invention, one of the two word lines which are provided in the row direction in the first embodiment is provided in the column direction as a bit line. Therefore, a memory cell can be selected by selecting one of the word lines and one of the bit lines. As a result, the data read operation can be performed on a memory cell-by-memory cell basis, but not on a row-by-row basis.

As described above, according to the non-volatile semiconductor memory device of the fourth embodiment of the present invention, data read can be performed on a memory cell-by-memory cell basis, and therefore, at least one differential circuit is only required. As a result, the circuit scale of the non-volatile semiconductor memory device can be reduced.

(Fifth embodiment)

Figure 5:
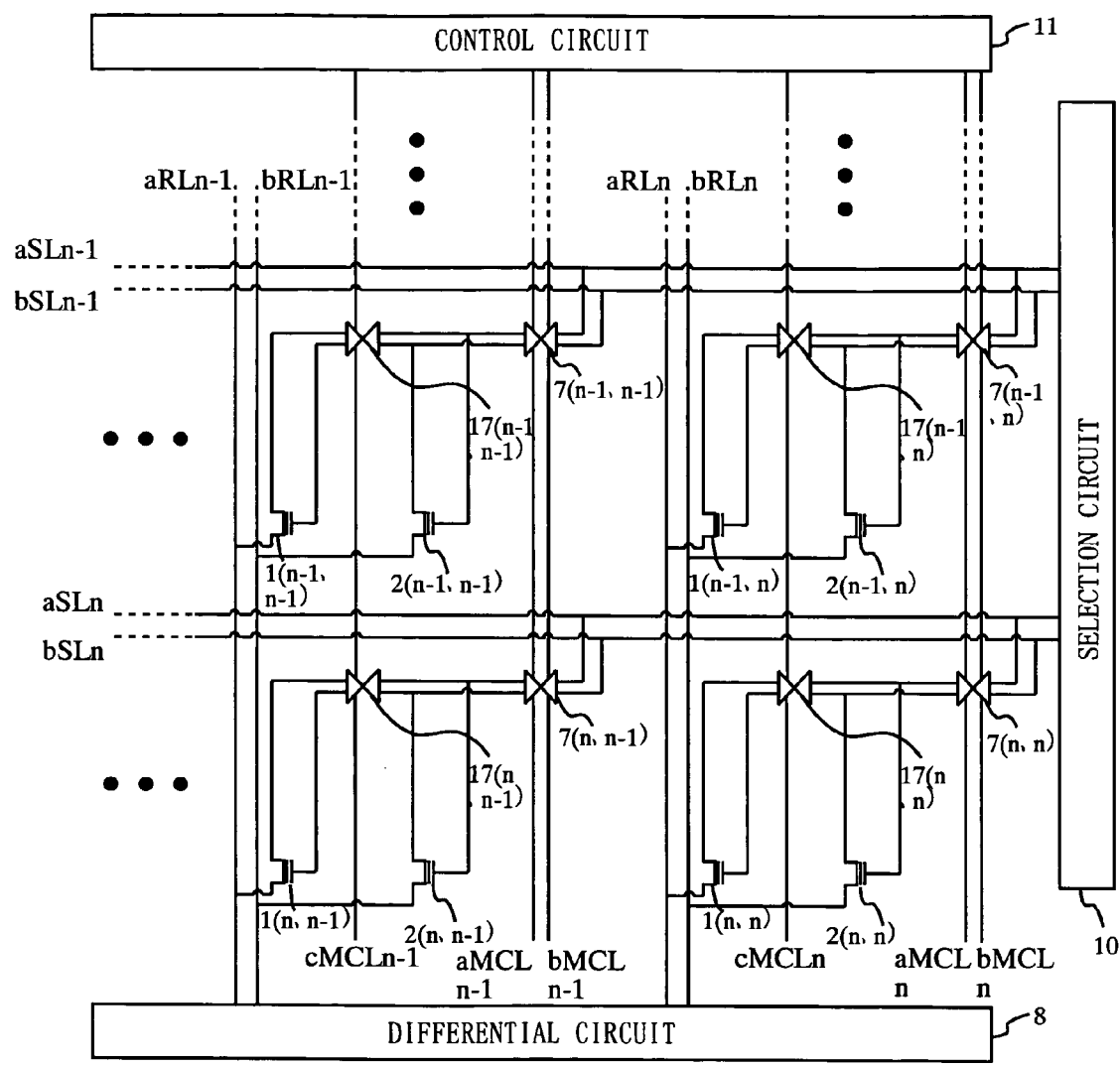
FIG. 5 is a diagram illustrating a structure of a non-volatile semiconductor memory device according to a fifth embodiment of the present invention.

Hereinafter, a non-volatile semiconductor memory device according to a fifth embodiment of the present invention will be described with reference to the accompanying drawings. FIG. 5 is a diagram illustrating a structure of the non-volatile semiconductor memory device of the fifth embodiment the present invention. In the non-volatile semiconductor memory device of FIG. 5, memory cells are arranged in a matrix of n×n (n is a natural number). FIG. 5 illustrates an extracted portion of the non-volatile semiconductor memory device.

The non-volatile semiconductor memory device of FIG. 5 comprises memory cells, source lines aSL1 to aSLn and bSL1 to bSLn, lead lines aRL1 to aRLn and bRL1 to bRLn, multiplexer control lines aMCL1 to aMCLn, bMCL1 to bMCLn and cMCL1 to cMCLn, a differential circuit 8, a selection circuit 10, and a control circuit 11. The number of the memory cells is n×n, each of which comprises a memory transistor 1, a memory transistor 2, a multiplexer 7, and a multiplexer 17. The non-volatile semiconductor memory device of the fifth embodiment of the present invention is different from the non-volatile semiconductor memory device of the fourth embodiment in that the multiplexer control lines cMCL1 to cMCLn are provided and also in that the multiplexer 17 is provided in each memory cell. The non-volatile semiconductor memory device of the fifth embodiment of the present invention is also different from the non-volatile semiconductor memory device of the second embodiment in an operation of the multiplexer 7. Thereby, in the non-volatile semiconductor memory device of the fifth embodiment of the present invention, data read can be performed on a memory cell-by-memory cell basis. Hereinafter, a connection between each component will be described.

Connections of the source lines aSL1 to aSLn and bSL1 to bSLn, the lead line aRL1 to aRLn and bRL1 to bRLn, the selection circuit 10, the memory transistor 1, and the memory transistor 2 are similar to those of the fourth embodiment and will not be explained.

The multiplexer control lines aMCL1 to aMCLn and the multiplexer control lines bMCL1 to bMCLn are wire lines which are paired on the respective columns, and each pair extends in the column direction. The multiplexer control lines cMCL1 to cMCLn are wire lines which extend in the column direction on the respective columns. The multiplexer control lines aMCL1 to aMCLn, the multiplexer control lines bMCL1 to bMCLn, and the multiplexer control lines cMCL1 to cMCLn are connected to the control circuit 11.

The multiplexer 7 is provided in each memory cell. The multiplexer control lines aMCL and bMCL which are provided on the same column as that of the multiplexer 7 are connected to the multiplexer 7. The multiplexer 17 is also provided in each memory cell. The multiplexer 17 is connected to the multiplexer control line cMCL which is provided on the same column as that of the multiplexer 17.

Hereinafter, a role of each component of the non-volatile semiconductor memory device of the fifth embodiment of the present invention will be described. Note that roles of the source lines aSL1 to aSLn and bSL1 to bSLn, the lead lines aRL1 to aRLn and bRL1 to bRLn, the selection circuit 10, the memory transistor 1, and the memory transistor 2 are similar to those of the fourth embodiment and will not be described.

The multiplexers 7 and 17 switch the connections of the source lines aSL and bSL and the memory transistors 1 and 2, depending on a voltage applied to the multiplexer control lines aMCL, bMCL and cMCL. Specifically, when a relatively high voltage (hereinafter referred to as an H voltage) is applied to the multiplexer control lines aMCL, bMCL and cMCL, the multiplexers 7 and 17 connect the source of the memory transistor 1 and the gate of the memory transistor 2 to the source line aSL, and the drain of the memory transistor 1 and the source of the memory transistor 2 to the source line bSL (hereinafter this connection is referred to as a parallel connection). When a relatively low voltage (hereinafter referred to as an L voltage) is applied to the multiplexer control lines aMCL and bMCL and the H voltage is applied to the multiplexer control line cMCL, the multiplexers 7 and 17 connect the gate of the memory transistor 1 and the source of the memory transistor 2 to the source line aSL, and the source of the memory transistor 1 and the gate of the memory transistor 2 to the source line bSL (hereinafter this connection is referred to as a first cross connection).

When the H voltage is applied to the multiplexer control lines aMCL and bMCL while the L voltage is applied to the multiplexer control line cMCL, the multiplexers 7 and 17 connect the gate of the memory transistor 1 and the source of the memory transistor 2 to the source line aSL, and the source of the memory transistor 1 and the gate of the memory transistor 2 to the source line bSL. Specifically, the multiplexer 7 connects the upper input and the upper output, and connects the lower input and the lower output in FIG. 5. The multiplexer 17 connects the upper input and the lower output, and connects the lower input and the upper output in FIG. 5 (hereinafter this connection is referred to as a second cross connection).

When the H voltage is applied to the multiplexer control line aMCL while the L voltage is applied to the multiplexer control lines bMCL and cMCL, the multiplexers 7 and 17 connect the gate of the memory transistor 1 and the gate of the memory transistor 2 to the source line aSL. Further, the connection between the source of the memory transistor 1 and the source of the memory transistor 2, and the source line bSL is interrupted. Specifically, the multiplexer 7 connects the upper input and the upper output, and interrupts the connection between the lower input and the lower output in FIG. 5. Further, the multiplexer 17 connects the upper input and the lower output, and connects the lower input and the upper output in FIG. 5 (hereinafter this connection is referred to as a partially interrupted state).

The control circuit 11 applies a predetermined voltage to the multiplexer control lines aMCL, bMCL and cMCL, depending on the operation. Specifically, the control circuit 11 applies the H voltage to the multiplexer control lines aMCL, bMCL and cMCL on a column on which a memory cell into which data "1" is to be written is provided. The control circuit 11 also applies the L voltage to the multiplexer control lines aMCL and bMCL on a column on which a memory cell into which data "0" is to be written is provided, and the H voltage to the multiplexer control line cMCL on a column on which a memory cell into which data "0" is to be written is provided.

During the read operation, the control circuit 11 applies the H voltage to all of the multiplexer control lines aMCL, the H voltage to the multiplexer control line bMCL on a column on which a memory cell from which data is to be read is provided, and the L voltage to the remaining multiplexer control lines bMCL. The control circuit 11 also applies the L voltage to all of the multiplexer control lines cMCL.

During the data read operation, the differential circuit 8 compares drain currents of the memory transistors 1 and 2 of a memory cell from which data is to be read to determine the data.

An operation of the thus-obtained non-volatile semiconductor memory device of the fifth embodiment of the present invention will be described. Note that the non-volatile semiconductor memory device performs a write operation and a read operation. Firstly, the write operation will be described.

The write operation is an operation which simultaneously writes data into memory cells on a row. In the following description, as an example of the write operation, data is now assumed to be written into memory cells provided on the n-th row. Specifically, it is also now assumed that data "0" is written into a memory cell on the (n–1)-th column, while data "1" is written into a memory cell on the n-th column.

During the write operation, the selection circuit 10 applies a voltage of 5 V to the source line aSLn on a row on which a memory cell into which data is to be written is provided, and a voltage of 0 V to the remaining source lines aSL and all of the source lines bSL.

Further, the control circuit 11 applies the H voltage to the multiplexer control lines aMCL, bMCL and cMCL on a column on which a memory cell into which data "1" is to be written is provided. The control circuit 11 also applies the L voltage to the multiplexer control lines aMCL and bMCL on a column on which a memory cell into which data "0" is to be written is provided, and the H voltage to the multiplexer control line CMCL on a column on which a memory cell into which data "0" is to be written is provided. Specifically, the control circuit 11 applies the H voltage to the multiplexer control lines aMCLn–1 and bMCLn–1, and the H voltage to the multiplexer control line cMCLn–1. The control circuit 11 also applies the L voltage to the multiplexer control lines aMCLn and bMCLn, and the H voltage to the multiplexer control line cMCLn.

The above-described voltage application causes the multiplexers 7(n, n–1) and 17(n, n–1) to be in the first cross connection. Also, the multiplexers 7(n, n) and 17(n, n) are caused to be in the parallel connection. As a result, a voltage of 0 V is applied to the source of the memory transistor 1(n, n–1), while a voltage of 5 V is applied to the gate of the memory transistor 1(n, n–1). Thereby, when electrons have not been injected in the floating gate of the memory transistor 1(n, n–1), Fowler-Nordheim current occurs, so that electrons are injected into the floating gate via the source or the substrate. A voltage of 5 V is applied to the source of the memory transistor 2(n, n–1), a voltage of 0 V is applied to the gate of the memory transistor 2(n, n–1). Thereby, when electrons have been injected in the floating gate of the memory transistor 2(n, n–1), the potential of the source induces and generates Fowler-Nordheim current, so that electrons are ejected from the floating gate. A voltage of 5 V is applied to the source of the memory transistor 1(n, n), while a voltage of 0 V is applied to the gate of the memory transistor 1(n, n). Thereby, when electrons have been injected in the floating gate of the memory transistor 1(n, n), the potential of the source induces and generates Fowler-Nordheim current, so that electrons are ejected from the floating gate. A voltage of 0 V is applied to the source of the memory transistor 2(n, n), while a voltage of 5 V is applied to the gate of the memory transistor 2(n, n). Thereby, when electrons have not been injected in the floating gate of the memory transistor 2(n, n), Fowler-Nordheim current occurs, so that electrons are injected into the floating gate via the source or the substrate. In this manner, data "0" is written into the memory cell on then-th row and the (n–1)-th column, while data "1" is written into the memory cell on the n-th row and the n-th column.

Next, the data read operation will be described. During the read operation of the non-volatile semiconductor memory device of the fifth embodiment of the present invention, data are read from memory cells on a row into the differential circuit 8. As an example of the read operation, data is now assumed to be read from the n-th row. It is also now assumed that data "0" is stored in the memory cell on the n-th row and the (n–1)-th column, while data "1" is stored in the memory on the n-th row and the n-th column. As an example of the read operation, data is now assumed to be read from the memory cell on the n-th row and the n-th column. It is also now assumed that data "1" is stored in the memory cell on the n-th row and the n-th column.

During the read operation, the selection circuit 10 applies a voltage of 1.5 V to the source lines aSLn and bSLn on a row on which a memory cell from which data is to be read is provided, and a voltage of 0 V to the remaining source lines aSL and bSL. The control circuit 11 applies the H voltage to the multiplexer control lines aMCL and bMCL on a column on which a memory cell from which data is to be read is provided, and the H voltage to the remaining multiplexer control line aMCL, and the L voltage to the remaining multiplexer control line bMCL. The control circuit 11 also applies the L voltage to all of the multiplexer control lines cMCL.

The above-described voltage application causes the multiplexers 7(n, n) and 17(n, n) on a column on which a memory cell from which data is to be read is provided, to be in the second cross connection. On the other hand, the multiplexers 7 and 17 other than the multiplexers 7(n, n) and 17(n, n) are caused to be in the partially interrupted state. As a result, a voltage of 1.5 V is applied to the source and gate of the memory transistor 1(n, n). A voltage of 1.5 V is applied to the source and gate of the memory transistor 2(n, n). The sources of the memory transistors 1 other than the memory transistors 1(n, n) and the sources of the memory transistors 2 other than the memory transistor 2(n, n) are caused to be in a high-impedance state. A voltage of 1.5 V is applied to the gates of the memory transistors 1 other than the memory transistor 1(n, n) and the gates of the memory transistors 2 other than the memory transistor 2(n, n).

According to the assumption, data "1" is stored in the memory cell of the n-th row and the n-th column. Therefore, electrons have not been injected in the floating gate of the memory transistor 1(n, n), while electrons have injected in the floating gate of the memory transistor 2(n, n). Therefore, a current flowing through the lead line aRLn is larger than a current flowing through the lead line bRLn. The differential circuit 8-n compares these currents to determine the data.

In this case, the differential circuit 8 determines that the read data is data "1". In this manner, data is read from memory cells on the n-th row.

As described above, according to the non-volatile semiconductor memory device of the fifth embodiment of the present invention, it is not necessary to perform an erase operation before a data write operation as in the non-volatile semiconductor memory device of the first embodiment. Thereby, it is possible to increase the speed of writing data.

According to the non-volatile semiconductor memory device of the fifth embodiment of the present invention, since the erase operation and the write operation are performed in a single step, the write operation of the non-volatile semiconductor memory device can be simplified.

According to the non-volatile semiconductor memory device of the fifth embodiment of the present invention, erroneous data read is less likely to occur as in the non-volatile semiconductor memory device of the first embodiment.

According to the non-volatile semiconductor memory device of the fifth embodiment of the present invention, during the write operation and the read operation, a voltage is applied to only the source lines aSL and bSL on a row on which a memory cell to/from which data is to be written/read is provided. As a result, the power consumption of the non-volatile semiconductor memory device can be reduced.

According to the non-volatile semiconductor memory device of the fifth embodiment of the present invention, the number of transistors provided in each memory cell is smaller than that of the first embodiment. As a result, the circuit scale of the non-volatile semiconductor memory device can be reduced.

As described above, according to the non-volatile semiconductor memory device of the fifth embodiment of the present invention, data read can be performed on a memory cell-by-memory cell basis, and therefore, at least one differential circuit is only required. As a result, the circuit scale of the non-volatile semiconductor memory device can be reduced.

Hereinafter, specific device structures of the memory transistors 1 and 2 of the first to the fifth embodiments will be described with reference to the accompanying drawings. FIG. 6 is a diagram illustrating an exemplary device structure of the memory transistors 1 and 2.

The memory transistor of FIG. 6 comprises a floating gate 101, a control diffusion region 102, a source 103, and a drain 104. The floating gate 101 is formed of polysilicon on a surface of a semiconductor substrate and plays a role in accumulation of electrons for storing data. The control diffusion region 102 is formed by injecting an impurity into the semiconductor substrate in a manner that allows the control diffusion region 102 to contact the floating gate 101 to play a role as a control gate. The source 103 and the drain 104 are formed on the surface of the semiconductor substrate by injecting an impurity into the semiconductor substrate in a manner that allows the source 103 and the drain 104 to interpose the floating gate 101.

By the memory transistors 1 and 2 being configured as illustrated in FIG. 6, the floating gate 101 can be composed of a single layer of polysilicon. Therefore, the gate electrodes of the other transistors 3 to 6 and the floating gate 101 can be formed simultaneously. As a result, the memory transistors 1 and 2 with a floating gate and the transistor 3 to 6 without a floating gate can be formed simultaneously. Thereby, the general versatility can be improved, the production process can be simplified, and the manufacturing cost can be reduced.

Figure 7:
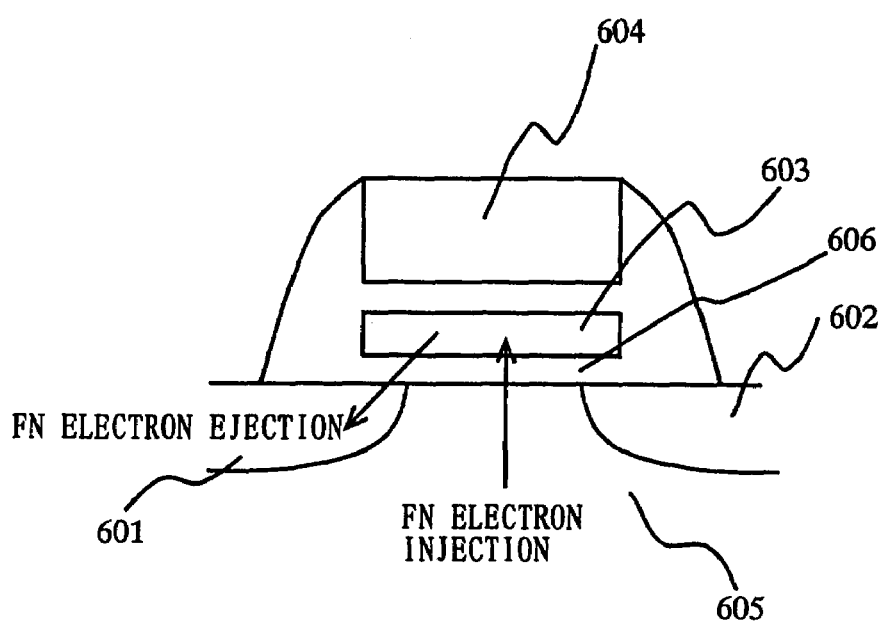
FIG. 7 is a diagram illustrating a general transistor having a floating gate.

Hereinafter, the write operation will be described in more detail. FIG. 7 illustrates a general transistor having a floating gate. Numerical reference 601 refers to the source, 602 refers to the drain, 603 refers to the floating gate, 604 refers to the control gate, 605 refers to the substrate, and 606 refers to the tunnel oxide film. In order to inject electrons into the floating gate 603 of the transistor, a high voltage (e.g., 5 V) is applied to the control gate 604, while the source 601, the drain 602 and the substrate 605 are set to be 0 V. In this case, Fowler-Nordheim current flows through the tunnel oxide film 606 due to electric field from the substrate 605 to the floating gate 603, resulting in injection of electrons. For ejection of electrons, a high voltage (e.g., 5 V) is applied to the source 601 to cause the control gate 604 to be 0 V. In this case, Fowler-Nordheim current flows through the tunnel oxide film 606 due to electric field from the floating gate 603 to the source 601, resulting in ejection of electrons.

Figure 8:
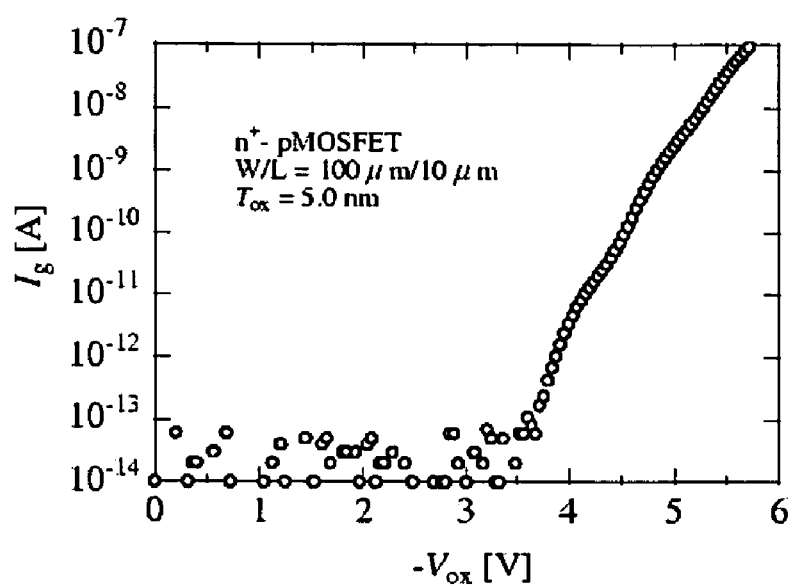
FIG. 8 is a diagram illustrating an empirical relationship between Fowler-Nordheim current and electric field applied to an oxide film where the oxide film has a thickness of 5 nm.

Next, a write time will be described. FIG. 8 is a graph illustrating an empirical relationship between Fowler-Nordheim current and electric field applied to the oxide film where the oxide film has a thickness of 5 nm. A time required for rewrite can be easily estimated based on a current amount.

For example, it is assumed that the floating gate has a capacitance of 0.1 fF, rewrite requires a Vt amplitude width of 0.5 V, a coupling capacitance between the floating gate and the substrate with respect to the whole floating gate is 0.8, the tunnel oxide film has an area of 0.06 μm, the tunnel oxide film has a thickness of 5 nm, and the high voltage is 5 V. In this case, Fowler-Nordheim current is $6\times10^{-16}$ A and a time required for rewrite is 583 ms. When high-speed rewrite is required, the high voltage is set to be a still higher value. For example, when the high voltage is 7.5 V, Fowler-Nordheim current is $1\times10^{-11}$ A and a time required for rewrite is 3.5 μs.

Figure 9:
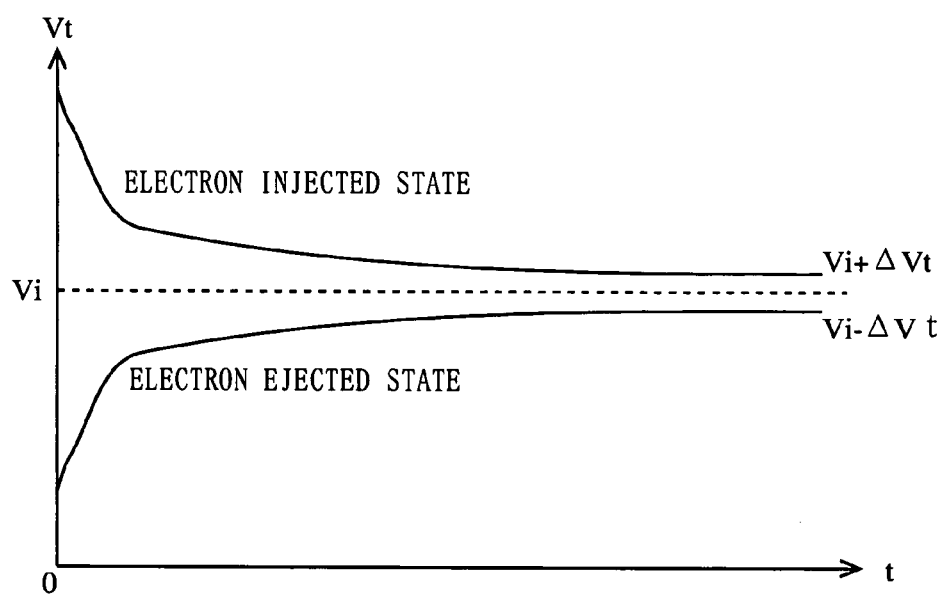
FIG. 9 is a diagram illustrating a change over time in threshold voltages of a memory transistor into which electrons have been injected and a memory transistor from which electrons have been ejected.

Hereinafter, a method of designing a memory transistor will be described with reference to the accompanying drawings. FIG. 9 is a diagram illustrating a change over time in threshold voltages of a memory transistor into which electrons have been injected and a memory transistor from which electrons have been ejected. The vertical axis represents a threshold voltage, while the horizontal axis represents a time.

As illustrated in FIG. 9, the threshold voltage of the memory transistor approaches a voltage Vi over time. Therefore, when the memory transistor which stores data is left as it is, a difference in threshold between the memory transistor which electrons have been injected and the memory transistor from which electrons have been ejected becomes small. As a result, it becomes difficult to accurately read out data.

In the above-described situation, a voltage Vi is applied to the gate of the memory transistor in order to accurately read out data, where the voltage Vi is determined, depending on the structure of the memory transistor. On the other hand, a voltage to be applied to the gate is a voltage of 1.5 V which is supplied from the selection circuit. Therefore, a circuit designer may design the memory transistor such that the voltage Vi is equal to 1.5 V supplied from the selection circuit. Thereby, even when the memory transistor is left as it is for a long time, data can be accurately read out.

According to the non-volatile semiconductor memory device of the present invention, data can be rewritten quickly and erroneous read is less likely to occur. The non-volatile semiconductor memory device of the present invention is useful as a non-volatile semiconductor memory device or the like in which a plurality of memory cells for storing data are arranged in a matrix.

While the invention has been described in detail, the foregoing description is in all aspects illustrative and not restrictive. It is understood that numerous other modifications and variations can be devised without departing from the scope of the invention.

What is claimed is:

1. A non-volatile semiconductor memory device, comprising:
    a plurality of memory cells of storing data, wherein the memory cells are arranged in a matrix and each of the memory cells comprises a first memory transistor and a second memory transistor each having a floating gate;
    a plurality of first wire lines arranged in a row direction, wherein a first voltage is applied to the first wire line during a data write operation;
    a plurality of second wire lines paired with the respective first wire lines and extending in the row direction, wherein a second voltage is applied to the second wire line, the second voltage being lower than the first voltage during the data write operation; and
    a switch section of switching connections of the first memory transistor, the second memory transistor, the first wire line, and the second wire line,
    wherein, when first type data is to be written into the memory cell, the switch section connects the first wire line to a gate of the first memory transistor and a source of the second memory transistor, and the second wire line to a source of the first memory transistor and a gate of the second memory transistor; and when a second type data is to be written into the memory cell, the switch section connects the first wire line to the source of the first memory transistor and the gate of the second memory transistor, and the second wire line to the gate of the first memory transistor and the source of the second memory transistor.

2. The non-volatile semiconductor memory device according to claim 1, wherein the switch section comprises:
    a plurality of switch circuits provided in the respective memory cells, of switching connections of the first wire line, the second wire line, the source of the first memory transistor, the source of the second memory transistor, the gate of the first memory transistor, and the gate of the second memory transistor; and
    a control section of controlling the switch circuit corresponding to the memory cell so that: when the first type data is to be written into the memory cell, the first wire line is connected to the gate of the first memory transistor and the source of the second memory transistor and the second wire line is connected to the gate of the second memory transistor and the source of the first memory transistor; and when the second type data is to be written into the memory cell, the first wire line is connected to the gate of the second memory transistor and the source of the first memory transistor and the second wire line is connected to the gate of the first memory transistor and the source of the second memory transistor.

3. The non-volatile semiconductor memory device according to claim 2, wherein:
    the switch section further comprises a plurality of switch control lines extending in a column direction on a corresponding column, and connected to a plurality of the switch circuits belonging to the corresponding column; and
    the control section controls, during the data write operation, the switch circuit belonging to the memory cell into which the first type data is to be written, via the switch control line to which the switch circuit is connected, so that the first wire line is connected to the gate of the first memory transistor and the source of the second memory transistor and the second wire line is connected to the gate of the second memory transistor and the source of the first memory transistor; and the switch circuit belonging to the memory cell into which the second type data is to be written, via the switch control line to which the switch circuit is connected, so that the first wire line is connected to the gate of the second memory transistor and the source of the first memory transistor and the second wire line is connected to the gate of the first memory transistor and the source of the second memory transistor.

4. The non-volatile semiconductor memory device according to claim 2, further comprising a selection section of applying the first voltage to all of the first wire lines and the second voltage to all of the second wire line when data is to be written into the memory cell,
    wherein the switch section comprises:
        a plurality of first switch elements of switching a conductive state and an interrupted state of a connection between the source of the respective first memory transistors and the switch circuit;
        a plurality of second switch elements of switching a conductive state and an interrupted state of a connection between the gate of the respective first memory transistors and the switch circuit;
        a plurality of third switch elements of switching a conductive state and an interrupted state of a connection between the source of the respective second memory transistors and the switch circuit;
        a plurality of fourth switch elements of switching a conductive state and an interrupted state of a connection between the gate of the respective second memory transistors and the switch circuit;
        a plurality of first control lines extending in the row direction on the respective rows and connected to the first switch elements belonging the respective rows and the respective third switch elements;
        a plurality of second control lines extending in the row direction on the respective rows and connected to the second switch elements belonging the respective rows and the respective fourth switch elements; and
        a control line selection section of controlling a conductive state and an interrupted state of each of the first, second, third and fourth switch elements,
    wherein, during the data write operation, the control line selection section controls the first, second, third and fourth switch elements of the memory cell into which data is to be written to be in the conductive state via the first control line and the second control line provided on a row to which said memory cell into which data is to be written belongs.

5. The non-volatile semiconductor memory device according to claim 2, further comprising a selection section of, when data is to be written into the memory cell, applying the first voltage to only the first wire line provided on a row to which the memory cell into which the data is to be written belongs, and the second voltage to only the second wire line which is paired with said first wire line.

6. The non-volatile semiconductor memory device according to claim 2, further comprising:
- a selection section of, when data is to be read from the memory cell, applying a third voltage to the first and second wire lines provided on a row to which the memory cell from which the data is to be read is provided; and
- a differential amplifier circuit of determining the data based on a drain current of the first memory transistor and a drain current of the second memory transistor when the selection section applies the third voltage.

7. The non-volatile semiconductor memory device according to claim 6, wherein the switch section comprises:
- a plurality of first switch elements of switching a conductive state and an interrupted state of a connection between the source of the respective first memory transistors and the switch circuit;
- a plurality of second switch elements of switching a conductive state and an interrupted state of a connection between the gate of the respective first memory transistors and the switch circuit;
- a plurality of third switch elements of switching a conductive state and an interrupted state of a connection between the source of the respective second memory transistors and the switch circuit;
- a plurality of fourth switch elements of switching a conductive state and an interrupted state of a connection between the gate of the respective second memory transistors and the switch circuit;
- a plurality of first control lines extending in the column direction on the respective columns and connected to the first switch elements belonging the respective columns and the respective third switch elements;
- a plurality of second control lines extending in the row direction on the respective rows and connected to the second switch elements belonging the respective rows and the respective fourth switch elements; and
- a control line selection section of controlling a conductive state and an interrupted state of each of the first, second, third and fourth switch elements, wherein, during the data write operation, the control line selection section controls the first, second, third and fourth switch elements of the memory cell from which data is to be read to be in the conductive state via the first control line on a column to which said memory cell from which data is to be read belongs and the second control line provided on a row to which said memory cell from which data is to be read belongs.

8. The non-volatile semiconductor memory device according to claim 6, wherein:
- each of the switch circuits can cause connections of the source of the first memory transistor, the source of the second memory transistor, the gate of the first memory transistor, and the gate of the second memory transistor to be the interrupted state; and
- the control section of, when data is to be read from the memory cell, causing the switch circuit to interrupt the connections of the source of the first memory transistor, the source of the second memory transistor, the gate of the first memory transistor, and the gate of the second memory transistor on columns on which the memory cells from data is not to be read are provided.

9. The non-volatile semiconductor memory device according to claim 6, wherein a threshold of each of the first and second memory transistors converges to a predetermined threshold when left as it is, and
- each of the first and second memory transistors has a structure such that the predetermined threshold is substantially equal to the third voltage.

10. The non-volatile semiconductor memory device according to claim 2, wherein, when the first type data is to be written into the memory cell, electrons are injected into the floating gate of the first memory transistor, while electrons are ejected from the floating gate of the second memory transistor, and
- when the second type data is to be written into the memory cell, electrons are ejected from the floating gate of the first memory transistor, while electrons are injected into the floating gate of the second memory transistor.

11. The non-volatile semiconductor memory device according to claim 1, wherein the floating gates of the first and second memory transistors are provided on a semiconductor substrate of the memory cell, and
- the first and second memory transistors comprises:
  - a diffusion layer provided on a surface of the semiconductor substrate, the floating gate being interposed between the diffusion layer and the surface of the semiconductor substrate; and
  - a control gate provided on the surface of the semiconductor substrate, contacting the floating gate.

* * * * *